(12) United States Patent
Lee et al.

(10) Patent No.: US 12,149,247 B2
(45) Date of Patent: Nov. 19, 2024

(54) FREQUENCY DIVIDER AND MEMORY DEVICE INCLUDING THE SAME

(71) Applicant: Samsung Electronics Co., Ltd., Suwon-si (KR)

(72) Inventors: Jaewoo Lee, Seoul (KR); Yoo-Chang Sung, Hwaseong-si (KR); Jeongdon Ihm, Suwon-si (KR); Hojun Chang, Seoul (KR); Jinseok Heo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 17/932,023

(22) Filed: Sep. 14, 2022

(65) Prior Publication Data

US 2023/0223941 A1    Jul. 13, 2023

(30) Foreign Application Priority Data

Jan. 12, 2022    (KR) ........................ 10-2022-0004912

(51) Int. Cl.
| | | |
|---|---|---|
| *H03K 21/02* | (2006.01) | |
| *G11C 11/4076* | (2006.01) | |
| *G11C 11/4093* | (2006.01) | |
| *H03K 23/40* | (2006.01) | |
| *G11C 7/10* | (2006.01) | |
| *G11C 7/22* | (2006.01) | |

(52) U.S. Cl.
CPC ........ *H03K 21/026* (2013.01); *G11C 11/4076* (2013.01); *G11C 11/4093* (2013.01); *H03K 23/40* (2013.01); *G11C 7/1093* (2013.01); *G11C 7/222* (2013.01)

(58) Field of Classification Search
CPC ............ G11C 11/4076; G11C 11/4093; G11C 7/1093; G11C 7/222; H03K 21/026; H03K 23/40; H03K 21/10; H03K 23/44; H03K 23/667
USPC ...................................... 365/230.03
See application file for complete search history.

(56) References Cited

U.S. PATENT DOCUMENTS

| | | | |
|---|---|---|---|
| 6,522,711 B2 | 2/2003 | Wakada et al. | |
| 7,348,818 B2 | 3/2008 | Hulfachor et al. | |
| 7,683,682 B1 | 3/2010 | Won et al. | |
| 8,829,966 B2 | 9/2014 | Chang et al. | |
| 9,154,077 B2 | 10/2015 | Chan | |
| 2004/0183588 A1* | 9/2004 | Chandrakasan | G05F 3/205 327/545 |
| 2010/0073040 A1 | 3/2010 | Jo et al. | |

FOREIGN PATENT DOCUMENTS

| | | | | |
|---|---|---|---|---|
| CN | 114172495 A | * | 3/2022 | ......... G01R 31/3016 |
| JP | 2018207281 A | * | 12/2018 | |
| KR | 100735451 B1 | | 7/2007 | |

* cited by examiner

*Primary Examiner* — Ly D Pham
(74) *Attorney, Agent, or Firm* — Myers Bigel, P.A.

(57) ABSTRACT

Disclosed is a frequency divider which includes a frequency dividing core circuit that includes a plurality of transistors and is configured to generate at least one division clock signal based on a clock signal and an inverted clock signal, a controller that is configured to generate a body bias control signal based on clock frequency information, and an adaptive body bias (ABB) generator that is configured to generate at least one body bias based on the body bias control signal and configured to apply the at least one body bias to a body of one or more of the plurality of transistors.

20 Claims, 12 Drawing Sheets

# FREQUENCY DIVIDER AND MEMORY DEVICE INCLUDING THE SAME

CROSS-REFERENCE TO RELATED APPLICATIONS

This application claims priority under 35 U.S.C. § 119 to Korean Patent Application No. 10-2022-0004912 filed on Jan. 12, 2022, in the Korean Intellectual Property Office, the disclosures of which are incorporated by reference herein in their entireties.

BACKGROUND

Embodiments of the present disclosure described herein relate to a frequency divider and a memory device including the same, and more particularly, relate to a frequency divider adaptively operating in a wide frequency band and a memory device including the same.

A frequency divider is configured to divide a frequency of an input signal at a given ratio and to output a signal having a frequency lower than the frequency of the input signal. In general, a self-oscillation frequency is one of the division characteristics of the frequency divider and is determined by characteristics of circuit elements included in the frequency divider. The self-oscillation frequency may be an important factor that determines a region in which the frequency divider is able to operate. In the case where a frequency of an input signal fluctuates, the frequency divider may be out of the region of operation. That is, there is the probability that the frequency division operation fails.

Nowadays, as a clock signal used in an electronic device (e.g., a memory device) diversifies and a frequency of the clock signal is variable, there is a continuous demand on a frequency divider adaptively operating in a wide frequency band. Research is being actively conducted to meet such demands.

SUMMARY

Embodiments of the present disclosure provide a frequency divider adaptively operating in a wide frequency band and a memory device including the same.

According to some embodiments, a frequency divider may include a frequency dividing core circuit that includes a plurality of transistors and is configured to generate at least one division clock signal based on a clock signal and an inverted clock signal, a controller that is configured to generate a body bias control signal based on clock frequency information, and an adaptive body bias (ABB) generator that is configured to generate at least one body bias based on the body bias control signal and is configured to apply the at least one body bias to a body of one or more of the plurality of transistors.

According to some embodiments, an operating method of a frequency divider may include generating a body bias control signal based on clock frequency information, adjusting a DC level of a body bias based on the body bias control signal, and applying the body bias with the adjusted DC level to a body of one or more of drive transistors and latch transistors.

According to some embodiments, a memory device may include a bank that includes at least one memory cell array, a bank controller that controls the bank, a data buffer that transmits write data to the bank or to receive read data from the bank, a clock buffer that receives a clock, a data clock buffer that receives a data clock, a synchronization circuit that performs phase synchronization on the data clock based on the clock and to output a synchronized data clock, an internal clock generator that includes a frequency divider and generates at least one internal clock based on the synchronized data clock, a serializer that operates based on the at least one internal clock and to serialize bits of the read data, and a deserializer that operates based on the at least one internal clock and to deserialize bits of the write data. The frequency divider may include a frequency dividing core circuit that includes a first latch including first and second drive transistors in a differential pair structure and first and second latch transistors in a cross-coupled structure, and a second latch including third and fourth drive transistors in the differential pair structure and third and fourth latch transistors in the cross-coupled structure, and divides the synchronized data clock to generate first to fourth internal clocks, a controller that generates a body bias control signal based on clock frequency information indicating a frequency of the synchronized data clock, and an adaptive body bias (ABB) generator that is configured to adjust a respective DC level of each of first and second body biases based on the body bias control signal, applies the first body bias with the adjusted respective DC level to a respective body of each of the first to fourth drive transistors, and applies the second body bias with the adjusted DC level to a respective body of each of the first to fourth latch transistors.

BRIEF DESCRIPTION OF THE DRAWINGS

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

Figure 1:
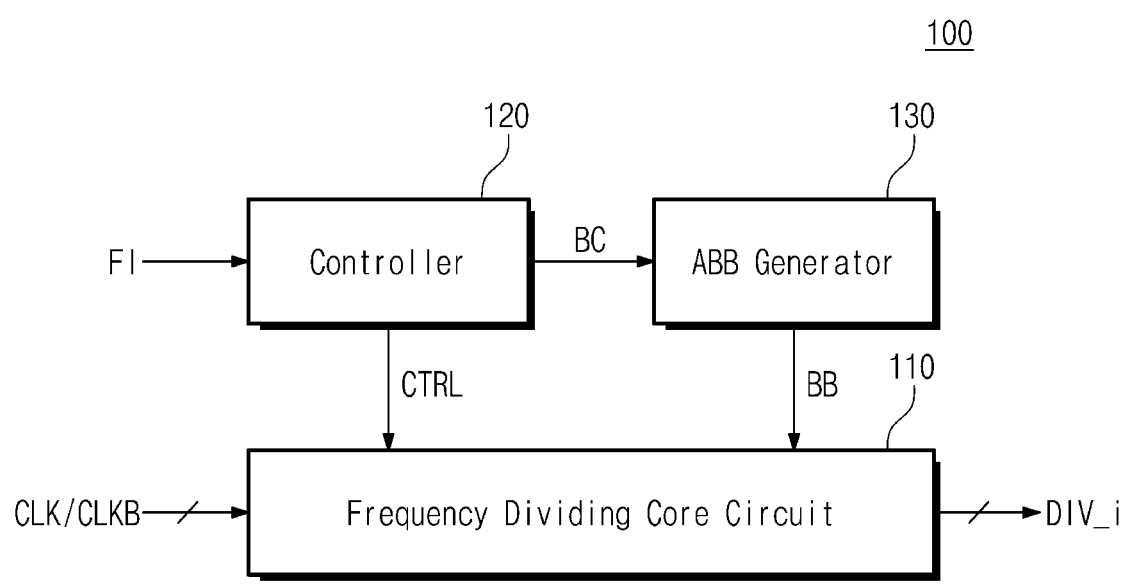
FIG. 1 is a block diagram illustrating a frequency divider according to some embodiments of the present disclosure.

FIG. 1 is a block diagram illustrating a frequency divider according to some embodiments of the present disclosure. A frequency divider 100 according to some embodiments of the present disclosure may include a frequency dividing core circuit 110, a controller 120, and an adaptive body bias (ABB) generator 130.

The frequency divider 100 may divide a frequency of a clock signal at a division ratio of "n", based on the clock signal. Herein, "n" is a natural number of 2 or more. The frequency divider 100 may divide the clock signal with an arbitrary or given division ratio. According to some embodiments of the present disclosure, the frequency divider 100 may be a divide-by-2 frequency divider. In some embodiments, the frequency divider 100 may divide a clock signal with a frequency of 10 MHz such that the clock signal has a frequency of 5 MHz. In some embodiments, the frequency divider 100 may divide a clock signal with a frequency of 50 MHz such that the clock signal has a frequency of 25 MHz. The frequency divider 100 may widen a division operation region by controlling internal circuit elements (or components) based on frequency information of an input clock signal.

The frequency dividing core circuit 110 may generate division clock signals DIV_i based on a clock signal CLK and an inverted clock signal CLKB. The inverted clock signal CLKB may have a phase that is opposite to a phase of the clock signal CLK (i.e., the inverted clock signal CLKB and the clock signal CLK may be 180 degrees out of phase). The division clock signals DIV_i may refer to clock signals that are obtained by dividing the clock signal CLK or the inverted clock signal CLKB at an arbitrary or given division ratio. Phases of the division clock signals DIV_i may be different from each other. Herein, "i" means a phase difference with the clock signal CLK and may have a number of 0 or more and 360 or less. For example, the division clock signal DIV_0 and the clock signal CLK may be in phase. The division clock signal DIV_90 may lag the clock signal CLK by 90 degrees. The division clock signal DIV_180 may lag the clock signal CLK by 180 degrees. The division clock signal DIV_270 may lag the clock signal CLK by 270 degrees. According to some embodiments of the present disclosure, the frequency dividing core circuit 110 may divide each of the clock signal CLK and the inverted clock signal CLKB at a division ratio of "2" and may generate four division clock signals DIV_0, DIV_90, DIV_180, and DIV_270 having different phases.

The frequency dividing core circuit 110 may adjust a dividing pass region by controlling various types of elements (e.g., active elements such as a transistor and/or a diode, or passive elements such as a resistor, a capacitor, and/or an inductor) included in the frequency dividing core circuit 110 based on at least one element control signal CTRL and/or at least one body bias BB. For example, the frequency dividing core circuit 110 may have a current mode logic (CML) structure, but the present disclosure is not limited thereto. A configuration and an operation of the frequency dividing core circuit 110 will be described in detail with reference to FIGS. 2 to 5.

The controller 120 may control operations of the frequency dividing core circuit 110 and the ABB generator 130. The controller 120 may generate a body bias control signal BC and/or the element control signal CTRL based on clock frequency information FI. The clock frequency information FI may refer to information about a frequency of the clock signal CLK. For example, the clock frequency information FI may include a digital code corresponding to a specific frequency range to which the clock signal CLK belongs. According to some embodiments of the present disclosure, the frequency divider 100 may further include counter logic (not illustrated) that counts the clock signal CLK to generate a digital code.

The controller 120 may control the frequency dividing core circuit 110 based on a frequency of the clock signal CLK, which is indicated by the clock frequency information FI. According to some embodiments of the present disclosure, the controller 120 may control the operation of the frequency dividing core circuit 110 such that a division operation region according to the frequency of the clock signal CLK is optimized.

The ABB generator 130 may generate at least one body bias BB based on the body bias control signal BC. The ABB generator 130 may adaptively adjust a DC level of the body bias BB. For example, the ABB generator 130 may increase, maintain, or decrease the DC level of the body bias BB. Although not illustrated, the ABB generator 130 may generate a plurality of body biases BB with arbitrary or given DC levels based on at least one reference voltage (not illustrated). Herein, the reference voltage (not illustrated) may be generated by a voltage generating circuit (not illustrated) (e.g., a bandgap reference circuit), and the voltage generating circuit (not illustrated) may be provided within the ABB generator 130 or may be provided on the outside of or external to the ABB generator 130.

The ABB generator 130 may be connected to a body of at least one transistor included in the frequency dividing core circuit 110. The ABB generator 130 may provide the body bias BB to the body of the at least one transistor. According to some embodiments of the present disclosure, the ABB generator 130 may generate a plurality of body biases BB. The plurality of body biases BB may be respectively transferred to bodies of different transistors, and may have the same voltage level or different voltage levels.

Figure 2:
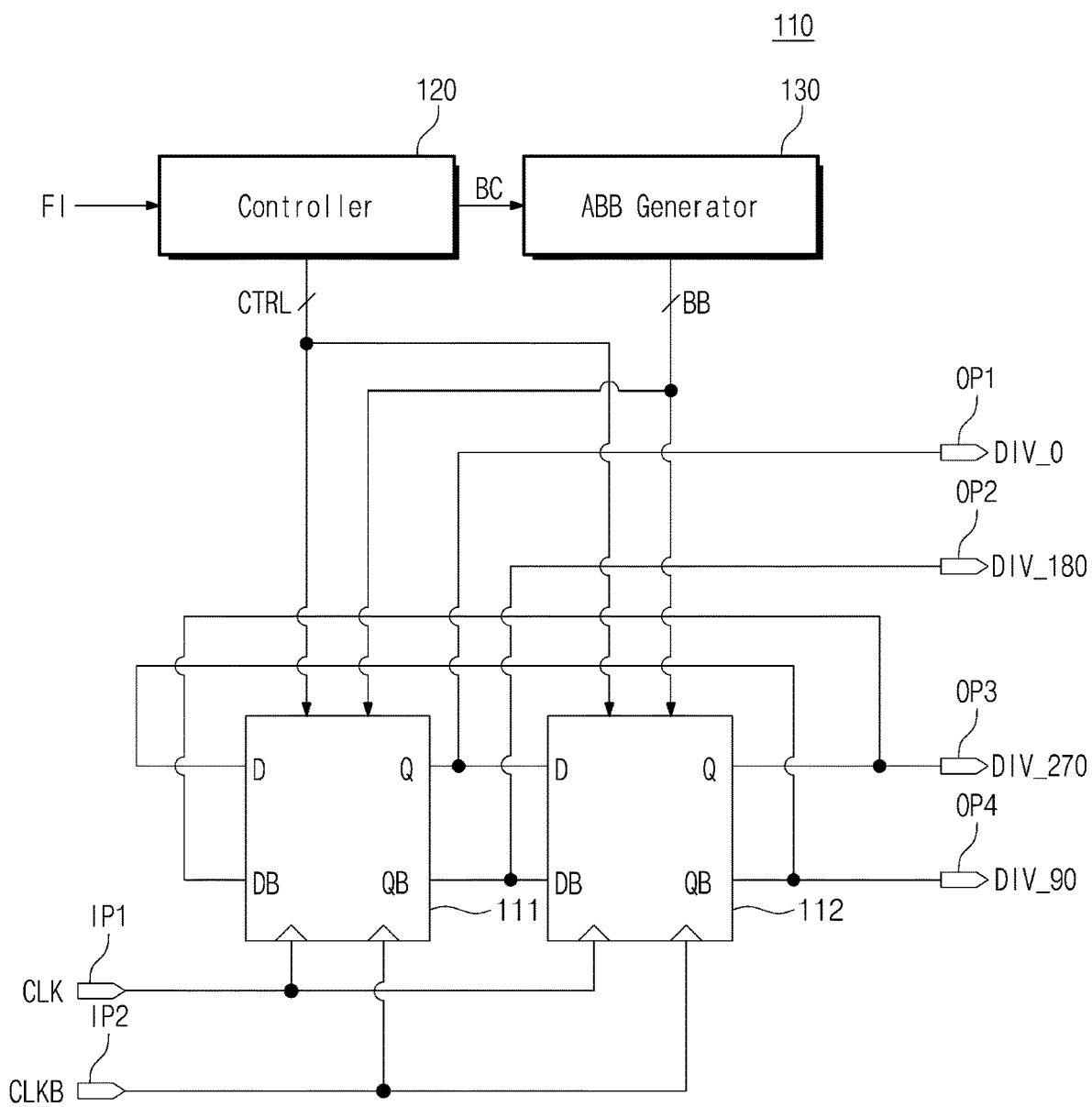
FIG. 2 is a block diagram illustrating a frequency dividing core circuit of FIG. 1 in detail.

FIG. 2 is a block diagram illustrating a frequency dividing core circuit of FIG. 1 in detail. The description given with reference to FIG. 1 will be omitted to avoid redundancy. Referring to FIGS. 1 and 2, the frequency dividing core circuit 110 may include input pins IP1 and IP2, a first latch 111, a second latch 112, and output pins OP1, OP2, OP3, and OP4.

Each of the input pins IP1 and IP2 may be a terminal provided with or receiving the clock signal CLK from the outside of the frequency divider 100 (e.g., from a host or a memory controller). The clock signal CLK and the inverted clock signal CLKB may be unidirectional signals that are input only to the frequency divider 100, and the input pins IP1 and IP2 may be input terminals. Two input pins IP1 and IP2 are illustrated in FIG. 2, but the present disclosure is not limited thereto. According to some embodiments of the present disclosure, unlike the example illustrated in FIG. 2, it may be well understood that the frequency dividing core circuit 110 receives only the clock signal CLK from the input pin IP1 and generates the inverted clock signal CLKB by using a logic circuit (e.g., a NOT gate).

Each of the first latch 111 and the second latch 112 may include an input terminal "D", an inverted input terminal DQ, an output terminal "Q", an inverted output terminal QB, a clock terminal, and an inverted clock terminal. Each of the first latch 111 and the second latch 112 may latch logical values of input signals received through the input terminal "D" and the inverted input terminal DB based on voltage levels (e.g., logical values of logic high or logic low) of the clock signal CLK and the inverted clock signal CLKB and may provide output signals of the latched logical values through the output terminal "Q" and the inverted output terminal QB. Although not illustrated, each of the first latch 111 and the second latch 112 may further include a reset terminal (not illustrated). For example, each of the first latch 111 and the second latch 112 may reset logical values of output signals output through the output terminal "Q" and the inverted output terminal QB to a given value (e.g., logic high or logic low) in response to a reset signal received through the reset terminal (not illustrated).

In the first latch 111, the clock terminal may be connected with the input pin IP1, the inverted clock terminal may be connected with the input pin IP2, the input terminal "D" may be connected with the inverted output terminal QB of the second latch 112, the inverted input terminal DB may be connected with the output terminal "Q" of the second latch 112, the output terminal "Q" may be connected with the output pin OP1 and the input terminal "D" of the second latch 112, and the inverted output terminal QB may be connected with the output pin OP2 and the inverted input terminal DB of the second latch 112. In the second latch 112, the clock terminal may be connected with the input pin IP1, the inverted clock terminal may be connected with the input pin IP2, the input terminal "D" may be connected with the output terminal "Q" of the first latch 111, the inverted input terminal DB may be connected with the inverted output terminal QB of the first latch 111, the output terminal "Q" may be connected with an output pin OP3 and the inverted input terminal DB of the first latch 111, and the inverted output terminal QB may be connected with an output pin OP4 and the input terminal "D" of the first latch 111.

According to some embodiments of the present disclosure, each of the first latch 111 and the second latch 112 may latch logical values of input signals (e.g., DIV_0, DIV_90, DIV_180, and DIV_270) based on logical values of the clock signal CLK and the inverted clock signal CLKB and may generate output signals (e.g., DIV_0, DIV_90, DIV_180, and DIV_270) based on the latched logical values. In detail, the first latch 111 may receive the division clock signals DIV_90 and DIV_270 and may output division clock signals DIV_0 and DIV_180 of different phases. The second latch 112 may receive the division clock signals DIV_0 and DIV_180 and may output division clock signals DIV_90 and DIV_270 of different phases.

The output pins OP1 to OP4 may be terminals outputting or transmitting the division clock signals DIV_0, DIV_90, DIV_180, and DIV_270 to the outside (e.g., a clock buffer, a control circuit, a phase locked loop (PLL), or a delay locked loop (DLL)) of the frequency divider 100. The division clock signals DIV_0, DIV_90, DIV_180, and DIV_270 may be unidirectional signals that are output from the frequency divider 100. According to some embodiments of the present disclosure, the frequency dividing core circuit 110 may further include at least one third latch (not illustrated). The third latch (not illustrated) may be connected with the first latch 111 and the second latch 112 and may output division clock signals (e.g., DIV 45, etc.) whose phases are different from those of the division clock signals DIV_0, DIV_90, DIV_180, and DIV_270, through different output pins. In this case, the different output pins for outputting the division clock signals of the different phases may be further provided.

The controller 120 may generate at least one element control signal CTRL based on the clock frequency information FI. The controller 120 may provide the same or different element control signals CTRL to the first latch 111 and the second latch 112. Likewise, the ABB generator 130 may generate at least one body bias BB based on the body bias control signal BC. The ABB generator 130 may provide the body biases BB of the same or different DC levels to the first latch 111 and the second latch 112. According to some embodiments of the present disclosure, the element control signal CTRL and/or the body biases BB may allow the frequency divider 100 to change a self-oscillation frequency.

Figure 3:
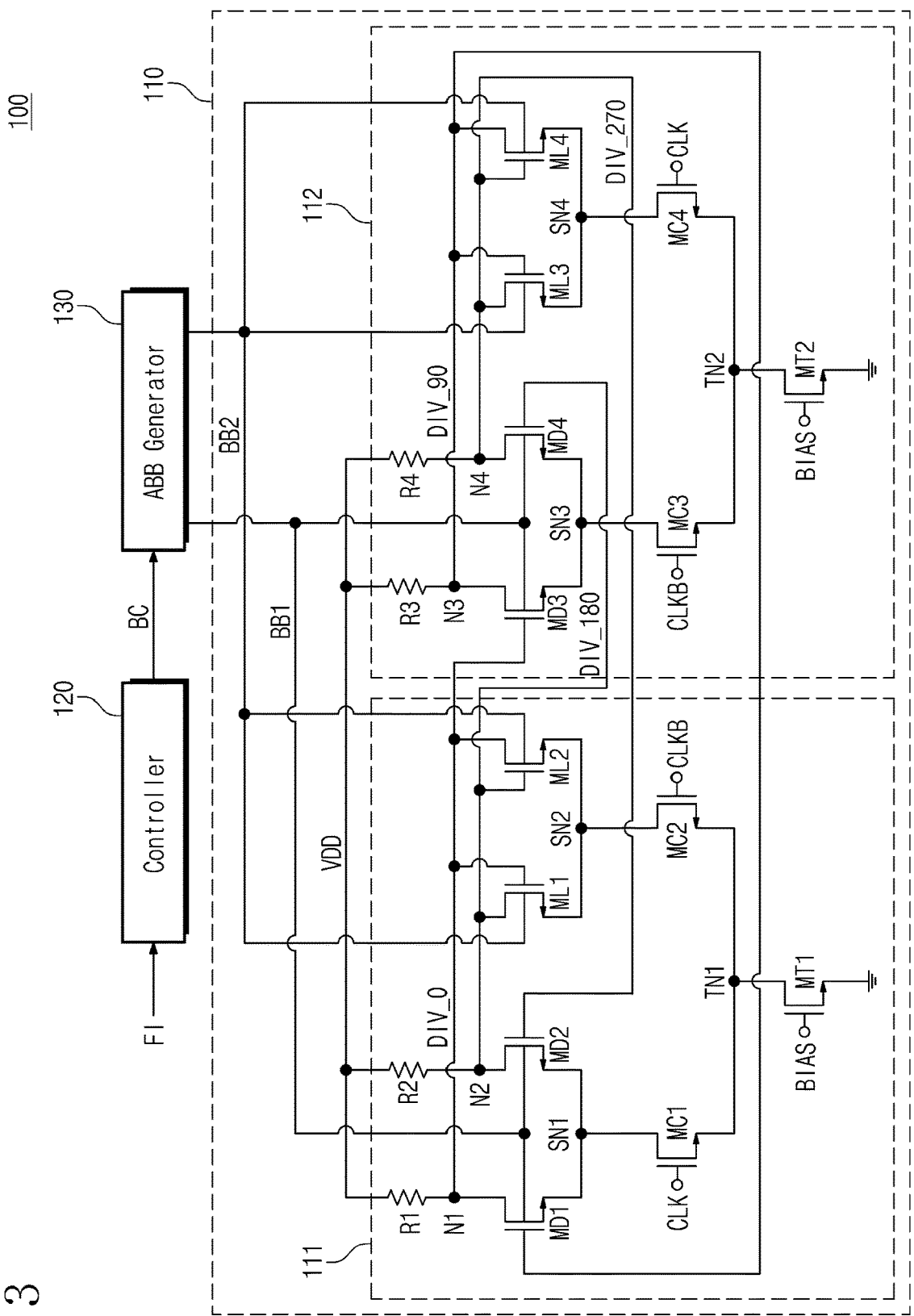
FIG. 3 is a circuit diagram illustrating a frequency divider according to some embodiments of the present disclosure in detail.

FIG. 3 is a circuit diagram illustrating a frequency divider according to some embodiments of the present disclosure in detail. The description given with reference to FIGS. 1 and 2 will be omitted to avoid redundancy. Referring to FIGS. 1, 2, and 3, the frequency dividing core circuit 110 may include the first latch 111 and the second latch 112.

According to some embodiments of the present disclosure, transistors MD1 to MD4, ML1 to ML4, MC1 to MC4, MT1, and MT2 illustrated in FIG. 3 may be p-channel metal-oxide-semiconductor (PMOS) transistors or n-channel metal-oxide-semiconductor (NMOS) transistors. For convenience of description, the description will be given under the assumption that the transistors MD1 to MD4, ML1 to ML4, MC1 to MC4, MT1, and MT2 are NMOS transistors, as a non-limiting example.

The first latch 111 may include first and second resistors R1 and R2, the first and second drive transistors MD1 and MD2, the first and second latch transistors ML1 and ML2, the first and second clock input transistors MC1 and MC2, and the first tail transistor MT1. The first resistor R1 may be connected between a power supply voltage (VDD) terminal and a first node N1. The second resistor R2 may be connected between the power supply voltage (VDD) terminal and a second node N2. The first and second drive transistors MD1 and MD2 may have a differential pair structure. The first and second latch transistors ML1 and ML2 may have a cross-coupled structure.

The first drive transistor MD1 may be connected between the first node N1 and a first source node SN1 and may operate in response to the division clock signal DIV_90. In detail, a first terminal (e.g., a drain) of the first drive transistor MD1 may be connected with the first node N1, a second terminal (e.g., a source) thereof may be connected with the first source node SN1, a third terminal (e.g., a gate) thereof may be connected with a third node N3, and a fourth terminal (e.g., a body) thereof may be connected with a first body bias BB1 terminal. The second drive transistor MD2 may be connected between the second node N2 and the first source node SN1 and may operate in response to the division clock signal DIV_270. In detail, a first terminal (e.g., a drain) of the second drive transistor MD2 may be connected with the second node N2, a second terminal (e.g., a source) thereof may be connected with the first source node SN1, a third terminal (e.g., a gate) thereof may be connected with a fourth node N4, and a fourth terminal (e.g., a body) thereof may be connected with the first body bias BB1 terminal.

The first clock input transistor MC1 may be connected between the first source node SN1 and a first tail node TN1 and may operate in response to the clock signal CLK. In detail, a first terminal (e.g., a drain) of the first clock input transistor MC1 may be connected with the first source node SN1, a second terminal (e.g., a source) thereof may be connected with the first tail node TN1, and a third terminal (e.g., a gate) thereof may be connected with a clock signal (CLK) terminal.

The first latch transistor ML1 may be connected between the second node N2 and a second source node SN2 and may operate in response to the division clock signal DIV_0. In detail, a first terminal (e.g., a drain) of the first latch transistor ML1 may be connected with the second node N2, a second terminal (e.g., a source) thereof may be connected with the second source node SN2, a third terminal (e.g., a gate) thereof may be connected with the first node N1, and a fourth terminal (e.g., a body) thereof may be connected with a second body bias BB2 terminal. The second latch transistor ML2 may be connected between the first node N1 and the second source node SN2 and may operate in response to the division clock signal DIV_180. In detail, a first terminal (e.g., a drain) of the second latch transistor ML2 may be connected with the first node N1, a second terminal (e.g., a source) thereof may be connected with the second source node SN2, a third terminal (e.g., a gate) thereof may be connected with the second node N2, and a fourth terminal (e.g., a body) thereof may be connected with the second body bias BB2 terminal.

The second clock input transistor MC2 may be connected between the second source node SN2 and the first tail node TN1 and may operate in response to the inverted clock signal CLKB. In detail, a first terminal (e.g., a drain) of the second clock input transistor MC2 may be connected with the second source node SN2, a second terminal (e.g., a source) thereof may be connected with the first tail node TN1, and a third terminal (e.g., a gate) thereof may be connected with an inverted clock signal (CLKB) terminal.

The first tail transistor MT1 may be connected between the first tail node TN1 and a ground voltage terminal and may operate in response to a bias voltage BIAS. In detail, a first terminal (e.g., a drain) of the first tail transistor MT1 may be connected with the first tail node TN1, a second terminal (e.g., a source) thereof may be connected with the ground voltage terminal, and a third terminal (e.g., a gate) thereof may be connected with a bias voltage (BIAS) terminal. For example, the first tail transistor MT1 may sink or source a tail current having an arbitrary or given level.

As in the first latch 111, the second latch 112 may include third and fourth resistors R3 and R4, the third and fourth drive transistors MD3 and MD4, the third and fourth latch transistors ML3 and ML4, the third and fourth clock input transistors MC3 and MC4, and the second tail transistor MT2. The third resistor R3 may be connected between the power supply voltage (VDD) terminal and the third node N3. The fourth resistor R4 may be connected between the power supply voltage (VDD) terminal and the fourth node N4. The third and fourth drive transistors MD3 and MD4 may have a differential pair structure. The third and fourth latch transistors ML3 and ML4 may have a cross-coupled structure.

The third drive transistor MD3 may be connected between the third node N3 and a third source node SN3 and may operate in response to the division clock signal DIV_0. In detail, a first terminal (e.g., a drain) of the third drive transistor MD3 may be connected with the third node N3, a second terminal (e.g., a source) thereof may be connected with the third source node SN3, a third terminal (e.g., a gate) thereof may be connected with the first node N1, and a fourth terminal (e.g., a body) thereof may be connected with the first body bias BB1 terminal. The fourth drive transistor MD4 may be connected between the fourth node N4 and the third source node SN3 and may operate in response to the division clock signal DIV_180. In detail, a first terminal (e.g., a drain) of the fourth drive transistor MD4 may be connected with the fourth node N4, a second terminal (e.g., a source) thereof may be connected with the third source node SN3, a third terminal (e.g., a gate) thereof may be connected with the second node N2, and a fourth terminal (e.g., a body) thereof may be connected with the first body bias BB1 terminal.

The third clock input transistor MC3 may be connected between the third source node SN3 and a second tail node TN2 and may operate in response to the inverted clock signal CLKB. In detail, a first terminal (e.g., a drain) of the third clock input transistor MC3 may be connected with the third source node SN3, a second terminal (e.g., a source) thereof may be connected with the second tail node TN2, and a third terminal (e.g., a gate) thereof may be connected with the inverted clock signal (CLKB) terminal.

The third latch transistor ML3 may be connected between the fourth node N4 and a fourth source node SN4 and may operate in response to the division clock signal DIV_90. In detail, a first terminal (e.g., a drain) of the third latch transistor ML3 may be connected with the fourth node N4, a second terminal (e.g., a source) thereof may be connected with the fourth source node SN4, a third terminal (e.g., a gate) thereof may be connected with the third node N3, and a fourth terminal (e.g., a body) thereof may be connected with the second body bias BB2 terminal. The fourth latch transistor ML4 may be connected between the third node N3 and the fourth source node SN4 and may operate in response to the division clock signal DIV_270. In detail, a first terminal (e.g., a drain) of the fourth latch transistor ML4 may be connected with the third node N3, a second terminal (e.g., a source) thereof may be connected with the fourth source node SN4, a third terminal (e.g., a gate) thereof may be connected with the fourth node N4, and a fourth terminal (e.g., a body) thereof may be connected with the second body bias BB2 terminal.

The fourth clock input transistor MC4 may be connected between the fourth source node SN4 and the second tail node TN2 and may operate in response to the clock signal CLK. In detail, a first terminal (e.g., a drain) of the fourth clock input transistor MC4 may be connected with the fourth source node SN4, a second terminal (e.g., a source) thereof may be connected with the second tail node TN2, and a third terminal (e.g., a gate) thereof may be connected with the clock signal (CLK) terminal.

The second tail transistor MT2 may be connected between the second tail node TN2 and the ground voltage terminal and may operate in response to the bias voltage BIAS. In detail, a first terminal (e.g., a drain) of the second tail transistor MT2 may be connected with the second tail node TN2, a second terminal (e.g., a source) thereof may be connected with the ground voltage terminal, and a third terminal (e.g., a gate) thereof may be connected with the bias voltage (BIAS) terminal. For example, the second tail transistor MT2 may sink or source a tail current having an arbitrary or given level.

According to some embodiments of the present disclosure, a voltage level of the first node N1 may be a voltage level of the division clock signal DIV_0, a voltage level of the second node N2 may be a voltage level of the division clock signal DIV_180, a voltage level of the third node N3 may be a voltage level of the division clock signal DIV_90, and a voltage level of the fourth node N4 may be a voltage level of the division clock signal DIV_270.

The ABB generator 130 may generate the first body bias BB1 and the second body bias BB2. The ABB generator 130 may adjust DC voltage levels of the first and second body biases BB1 and BB2 based on the clock frequency information FI. According to some embodiments of the present disclosure, the first body bias BB1 may be applied to the bodies of each of the first to fourth drive transistors MD1 to MD4.

A gain of each of the first to fourth drive transistors MD1 to MD4 may be changed by the DC voltage level of the first body bias BB1. For example, as the level of the first body bias BB1 increases, the gain of each of the first to fourth drive transistors MD1 to MD4 may increase.

According to some embodiments of the present disclosure, the second body bias BB2 may be applied to the bodies of each of the first to fourth latch transistors ML1 to ML4. Likewise, a gain of each of the first to fourth latch transistors ML1 to ML4 may be changed by the DC voltage level of the second body bias BB2. For example, as the level of the second body bias BB2 increases, the gain of each of the first to fourth latch transistors ML1 to ML4 may increase.

In some embodiments, the first to fourth drive transistors MD1 to MD4 may have the same gain. Also, the first to fourth latch transistors ML1 to ML4 may have the same gain. Below, the self-oscillation frequency of the frequency dividing core circuit 110 will be described based on the gain of the first drive transistor MD1 and the gain of the first latch transistor ML1.

As a ratio (MD:ML) of the gain of the first drive transistor MD1 to the gain of the first latch transistor ML1 increases, the self-oscillation frequency of the frequency dividing core circuit 110 may increase.

TABLE 1

|  | ML |  |  |  |  | DEF | MD |  |  |  |  |
|---|---|---|---|---|---|---|---|---|---|---|---|
| Body Bias (mV) | 250 | 200 | 150 | 100 | 50 | / | 50 | 100 | 150 | 200 | 250 |
| Fso (Mbps) | 8000 | 8120 | 8280 | 8440 | 8600 | 8800 | 8920 | 9080 | 9280 | 9600 | 9600 |

Table 1 shows a self-oscillation frequency Fso when a body bias of a specific level is applied to bodies of the latch transistors ML and the drive transistors MD according to some embodiments of the present disclosure. In some embodiments, it is assumed that the self-oscillation frequency Fso of the frequency divider 100 is 8800 Mbps being a default value DEF. Herein, the default value DEF that is a basic setting value of the frequency divider 100 means a self-oscillation frequency corresponding to the case where an additional body bias is not applied to the bodies of the latch transistors ML and the drive transistors MD. Referring to FIG. 3 and Table 1, as a level of the first body bias BB1 increases, the self-oscillation frequency Fso may become higher. In contrast, as a level of the second body bias BB2 increases, the self-oscillation frequency Fso may become lower. That is, the frequency divider 100 may adaptively adjust the self-oscillation frequency Fso based on the clock frequency information FI. For example, in the case where the clock signal CLK whose frequency is higher than the default value DEF is received, the ABB generator 130 may increase the DC level of the first body bias BB1. That is, the controller 120 may generate the body bias control signal BC indicating an increase in the DC level of the first body bias BB1.

In contrast, in the case where the clock signal CLK whose frequency is lower than the default value DEF is received, the ABB generator 130 may increase the DC level of the second body bias BB2. That is, the controller 120 may generate the body bias control signal BC indicating an increase in the DC level of the second body bias BB2. According to some embodiments of the present disclosure, a dividing pass region of the frequency divider 100 may widen by adjusting a self-oscillation frequency. The dividing pass region and the self-oscillation frequency of the frequency divider 100 will be described in detail with reference to FIGS. 7A to 7C.

Figure 4:
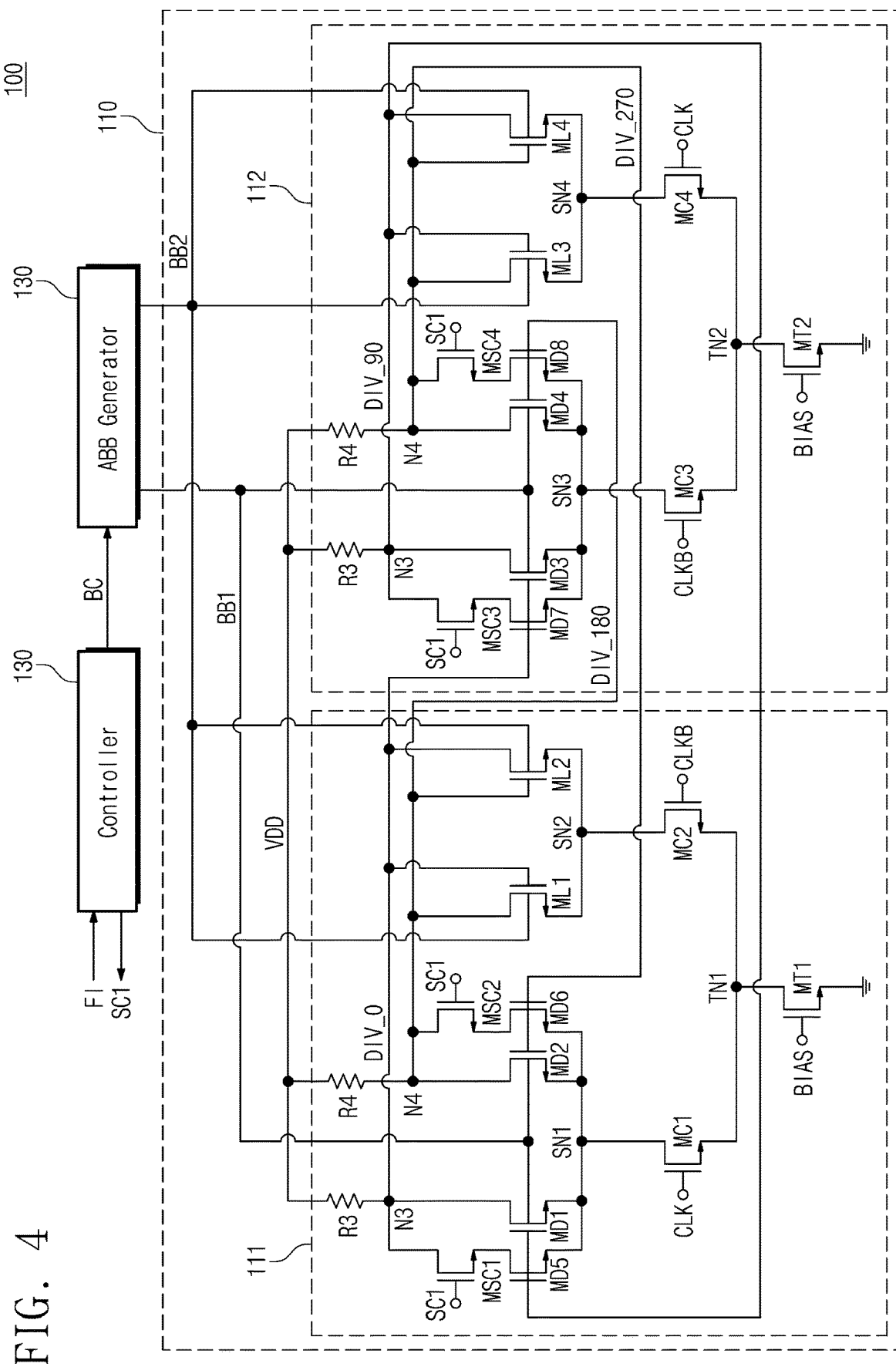
FIG. 4 is a circuit diagram illustrating a frequency divider according to some embodiments of the present disclosure.

FIG. 4 is a circuit diagram illustrating a frequency divider according to some embodiments of the present disclosure. The description given with reference to FIGS. 1 to 3 will be omitted to avoid redundancy. Referring to FIGS. 3 and 4, the frequency dividing core circuit 110 may further include first to fourth size control transistors MSC1 to MSC4 and fifth to eighth drive transistors MD5 to MD8.

In some embodiments, the controller 120 may generate a first size control signal SC1 based on the clock frequency information FI. The first to fourth size control transistors MSC1 to MSC4 may be turned on or turned off in response to the first size control signal SC1. An example in which the first size control signal SC1 is input to gates of the first to fourth size control transistors MSC1 to MSC4 is illustrated in FIG. 4, but the present disclosure is not limited thereto. For example, the controller 120 may generate a plurality of first size control signals, and the plurality of first size control signals may be respectively applied to the gates of the first to fourth size control transistors MSC1 to MSC4.

The fifth drive transistor MD5 may be connected between the first size control transistor MSC1 and the first source node SN1 and may operate in response to the division clock signal DIV_90. Likewise, the sixth drive transistor MD6 may be connected between the second size control transistor MSC2 and the first source node SN1 and may operate in response to the division clock signal DIV_270. The seventh drive transistor MD7 may be connected between the third size control transistor MSC3 and the third source node SN3 and may operate in response to the division clock signal DIV_0. The eighth drive transistor MD8 may be connected between the fourth size control transistor MSC4 and the third source node SN3 and may operate in response to the division clock signal DIV_180.

For example, when the first size control transistor MSC1 is turned on, the fifth drive transistor MD5 may be connected in parallel with the first drive transistor MD1. In this case, the fifth drive transistor MD5 and the first drive transistor MD1 may share the first to third terminals (e.g., a drain, a source, and a gate). According to some embodiments of the present disclosure, although not illustrated, the fifth drive transistor MD5 and the first drive transistor MD1 may share the fourth terminal (e.g., a body). As the fifth drive transistor MD5 and the first drive transistor MD1 are connected in parallel, a channel width that a transistor forms may increase. Relationships between the sixth drive transistor MD6 and the second drive transistor MD2, between the seventh drive transistor MD7 and the third drive transistor MD3, between the eighth drive transistor MD8 and the fourth drive transistor MD4 are similar to the relationship between the fifth drive transistor MD5 and the first drive transistor MD1, and thus, additional description will be omitted to avoid redundancy.

As a result, gains of the first to eighth drive transistors MD1 to MD8 when the first to fourth size control transistors MSC1 to MSC4 are turned on may be different from gains of the first to fourth drive transistors MD1 to MD4 when the first to fourth size control transistors MSC1 to MSC4 are turned off. Accordingly, the controller 120 may adjust the self-oscillation frequency of the frequency dividing core circuit 110 by controlling a logical value of the first size control signal SC1 based on the clock frequency information FI.

According to some embodiments of the present disclosure, although not illustrated, the frequency dividing core circuit 110 may further include a plurality of drive transistors that are connected in parallel with the first to fourth drive transistors MD1 to MD4, in addition to the fifth to eighth drive transistors MD5 to MD8.

Figure 5:
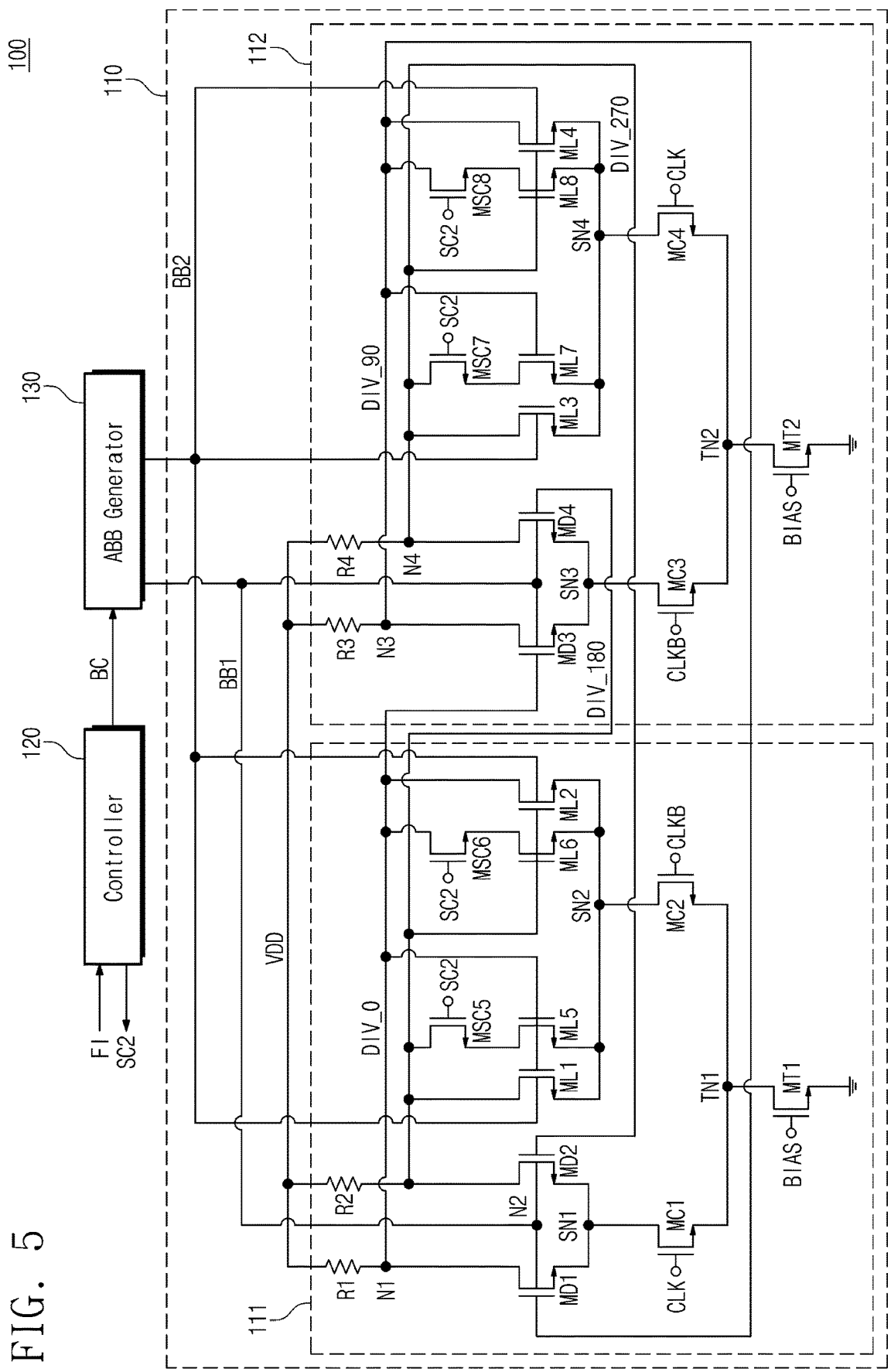
FIG. 5 is a circuit diagram illustrating a frequency divider according to some embodiments of the present disclosure.

FIG. 5 is a circuit diagram illustrating a frequency divider according to some embodiments of the present disclosure. The description given with reference to FIGS. 1 to 4 will be omitted to avoid redundancy. Referring to FIGS. 3 and 5, the frequency dividing core circuit 110 may further include fifth to eighth size control transistors MSC5 to MSC8 and fifth to eighth latch transistors ML5 to ML8.

In some embodiments, the controller 120 may generate a second size control signal SC2 based on the clock frequency information FI. The fifth to eighth size control transistors MSC5 to MSC8 may be turned on or turned off in response to the second size control signal SC2. An example in which the second size control signal SC2 is input to gates of the fifth to eighth size control transistors MSC5 to MSC8 is illustrated in FIG. 5, but the present disclosure is not limited thereto. For example, the controller 120 may generate a plurality of second size control signals, and the plurality of second size control signals may be respectively applied to the gates of the fifth to eighth size control transistors MSC5 to MSC8.

The fifth latch transistor ML5 may be connected between the fifth size control transistor MSC5 and the second source node SN2 and may operate in response to the division clock signal DIV_0. Likewise, the sixth latch transistor ML6 may be connected between the sixth size control transistor MSC6 and the second source node SN2 and may operate in response to the division clock signal DIV_180. The seventh latch transistor ML7 may be connected between the seventh size control transistor MSC7 and the fourth source node SN4 and may operate in response to the division clock signal DIV_90. The eighth latch transistor ML8 may be connected between the eighth size control transistor MSC8 and the fourth source node SN4 and may operate in response to the division clock signal DIV_270.

Relationships between the fifth latch transistor ML5 and the first latch transistor ML1, between the sixth latch transistor ML6 and the second latch transistor ML2, between the seventh latch transistor ML7 and the third latch transistor ML3, and the eighth latch transistor ML8 and the fourth latch transistor ML4 are similar to the relationship between the fifth drive transistor MD5 and the first drive transistor MD1 described with reference to FIG. 4, and thus, additional description will be omitted to avoid redundancy.

As a result, gains of the first to eighth latch transistors ML1 to ML8 when the fifth to eighth size control transistors MSC5 to MSC8 are turned on may be different from gains of the first to fourth latch transistors ML1 to ML4 when the fifth to eighth size control transistors MSC5 to MSC8 are turned off. Accordingly, the controller 120 may adjust the self-oscillation frequency of the frequency dividing core circuit 110 by controlling a logical value of the second size control signal SC2 based on the clock frequency information FI.

According to some embodiments of the present disclosure, although not illustrated, the frequency dividing core circuit 110 may further include a plurality of latch transistors that are connected in parallel with the first to fourth latch transistors ML1 to ML4, in addition to the fifth to eighth latch transistors ML5 to ML8.

Figure 6:
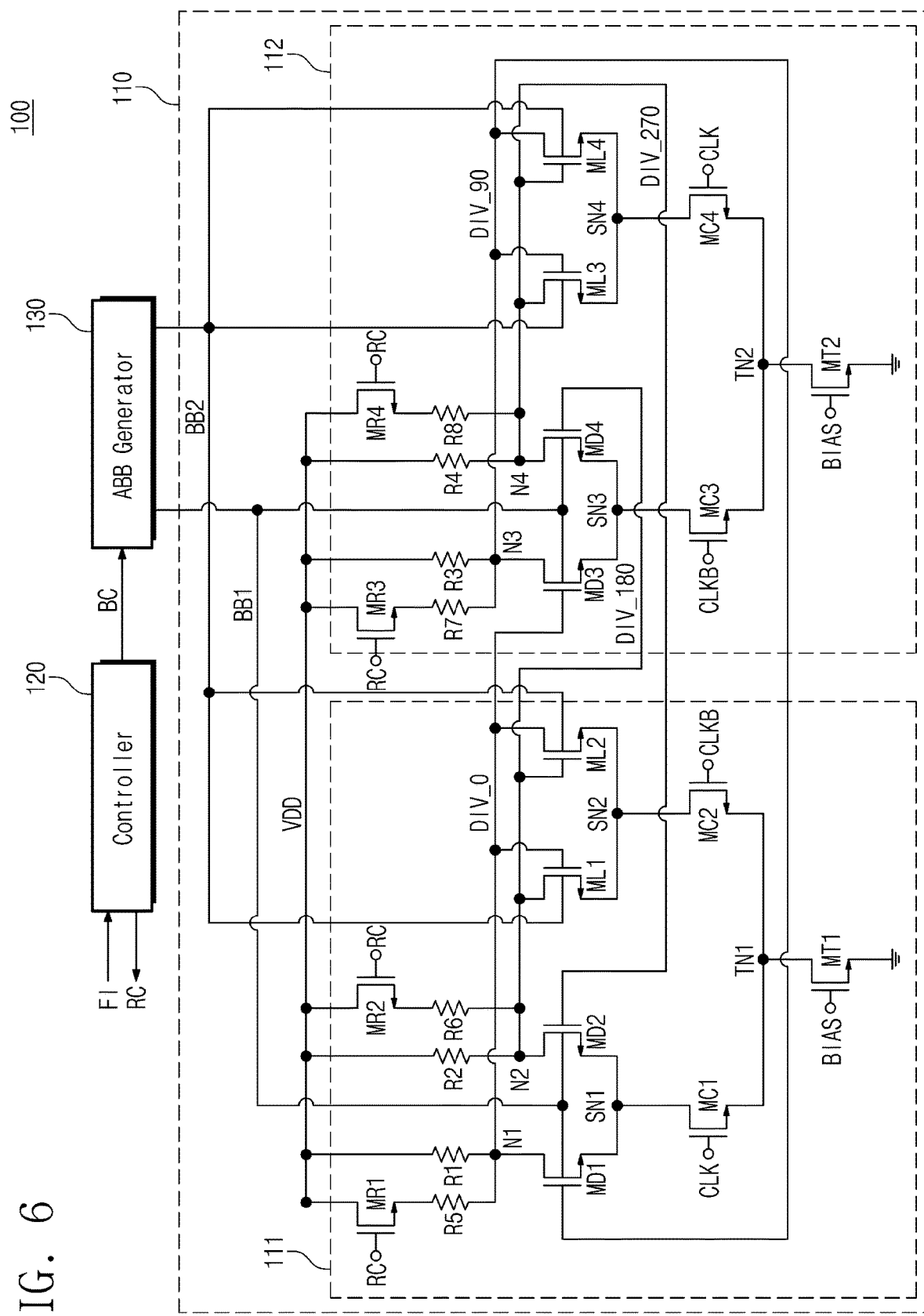
FIG. 6 is a circuit diagram illustrating a frequency divider according to some embodiments of the present disclosure in detail.

FIG. 6 is a circuit diagram illustrating a frequency divider according to some embodiments of the present disclosure in detail. The description given with reference to FIGS. 1 to 3 will be omitted to avoid redundancy. Referring to FIGS. 3 and 6, the frequency dividing core circuit 110 may further include fifth to eighth resistors R5 to R8 and first to fourth resistor control transistors MR1 to MR4.

In some embodiments, the controller 120 may generate a resistor control signal RC based on the clock frequency information FI. The first to fourth resistor control transistors MR1 to MR4 may be turned on or turned off in response to the resistor control signal RC. An example in which the resistor control signal RC is input to gates of the first to fourth resistor control transistors MR1 to MR4 is illustrated in FIG. 6, but the present disclosure is not limited thereto. For example, the controller 120 may generate a plurality of resistor control signals, and the plurality of resistor control signals may be respectively applied to the gates of the first to fourth resistor control transistors MR1 to MR4.

The fifth resistor R5 may be connected between the first resistor control transistor MR1 and the first node N1. The sixth resistor R6 may be connected between the second resistor control transistor MR2 and the second node N2. The seventh resistor R7 may be connected between the third resistor control transistor MR3 and the third node N3. The eighth resistor R8 may be connected between the fourth resistor control transistor MR4 and the fourth node N4.

For example, when the first resistor control transistor MR1 is turned on, the fifth resistor R5 may be connected in parallel with the first resistor R1. As the fifth resistor R5 and the first resistor R1 are connected in parallel, a resistance value between the power supply voltage (VDD) terminal and the first node N1 may change. Relationships between the sixth resistor R6 and the second resistor R2, between the seventh resistor R7 and the third resistor R3, between the eighth resistor R8 and the fourth resistor R4 are similar to the relationship between the fifth resistor R5 and the first resistor R1, and thus, additional description will be omitted to avoid redundancy.

As a result, gains of the transistors MD1 to MD4 and ML1 to ML4 when the first to fourth resistor control transistors MR1 to MR4 are turned on may be different from gains of the transistors MD1 to MD4 and ML1 to ML4 when the first to fourth resistor control transistors MR1 to MR4 are turned off. Accordingly, the controller 120 may adjust the self-oscillation frequency of the frequency dividing core circuit 110 by controlling a logical value of the resistor control signal RC based on the clock frequency information FI.

According to some embodiments of the present disclosure, although not illustrated, the frequency dividing core circuit 110 may further include a plurality of resistors that are connected in parallel with the first to fourth resistors R1 to R4, in addition to the fifth to eighth resistors R5 to R8.

Unlike the configurations illustrated in FIGS. 4 to 6, the frequency dividing core circuit 110 according to some embodiments of the present disclosure may be implemented with an arbitrary combination further including at least ones of the first to fourth size control transistors MSC1 to MSC4, the fifth to eighth drive transistors MD5 to MD8, the fifth to eighth size control transistors MSC5 to MSC8, the fifth to eighth latch transistors ML5 to ML8, the fifth to eighth resistors R5 to R8, and the first to fourth resistor control transistors MR1 to MR4. However, the present disclosure is not limited thereto. The frequency dividing core circuit 110 may further include an arbitrary passive element or an arbitrary active element.

Figure 7A:
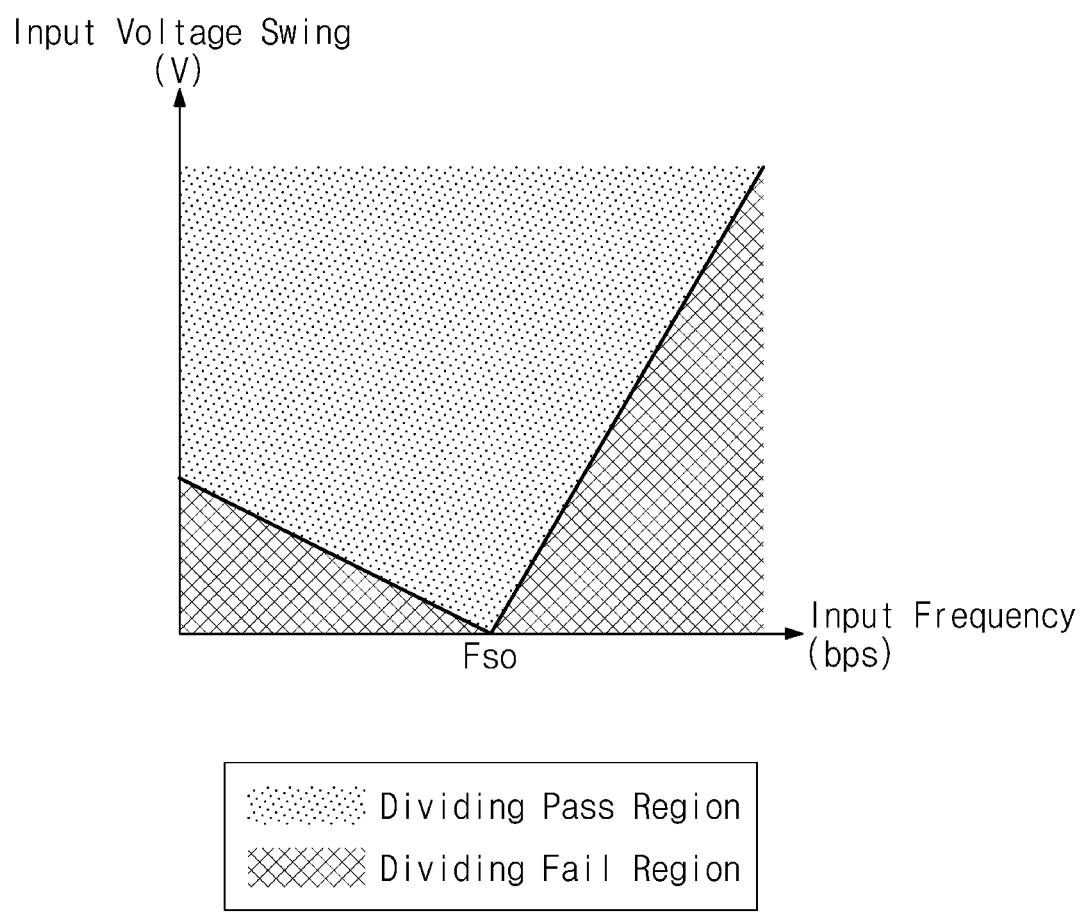
FIGS. 7A to 7C are graphs illustrating division characteristics of a frequency divider according to some embodiments of the present disclosure.
Figure 7B:
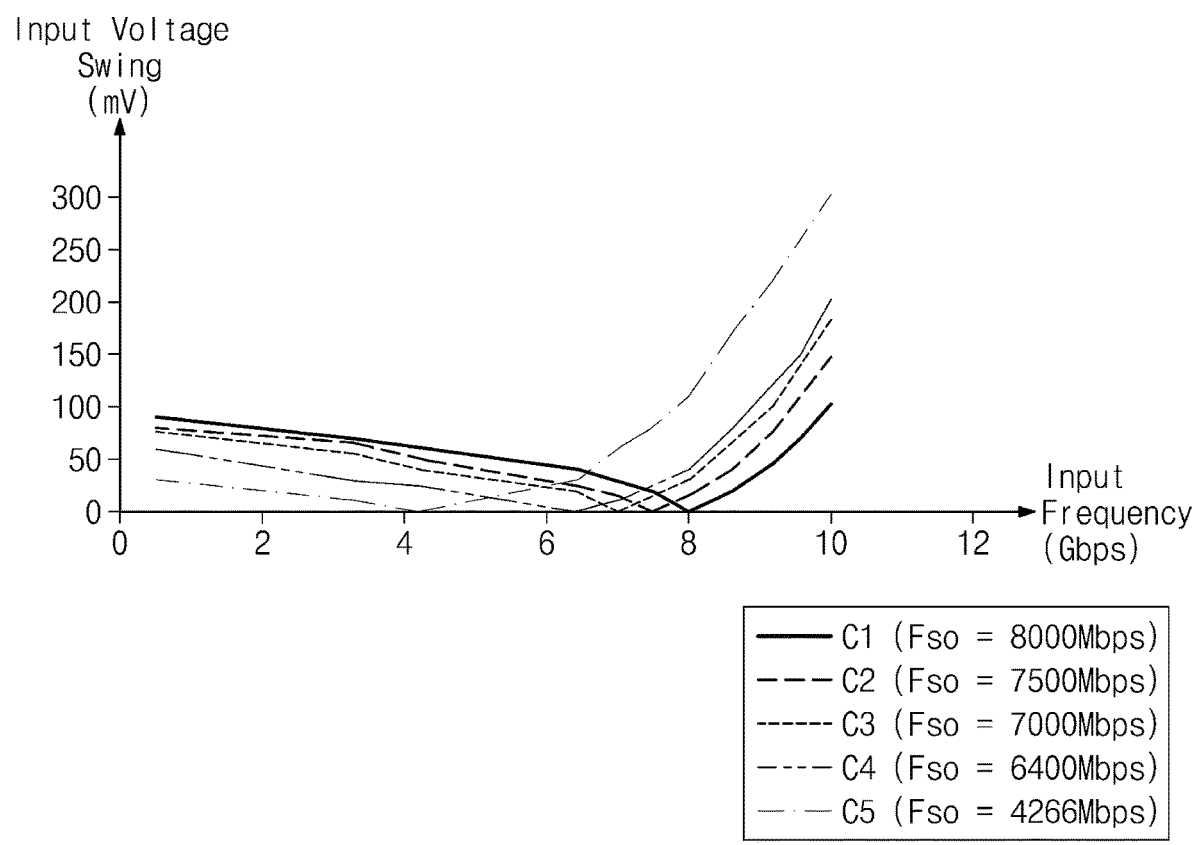
Figure 7C:
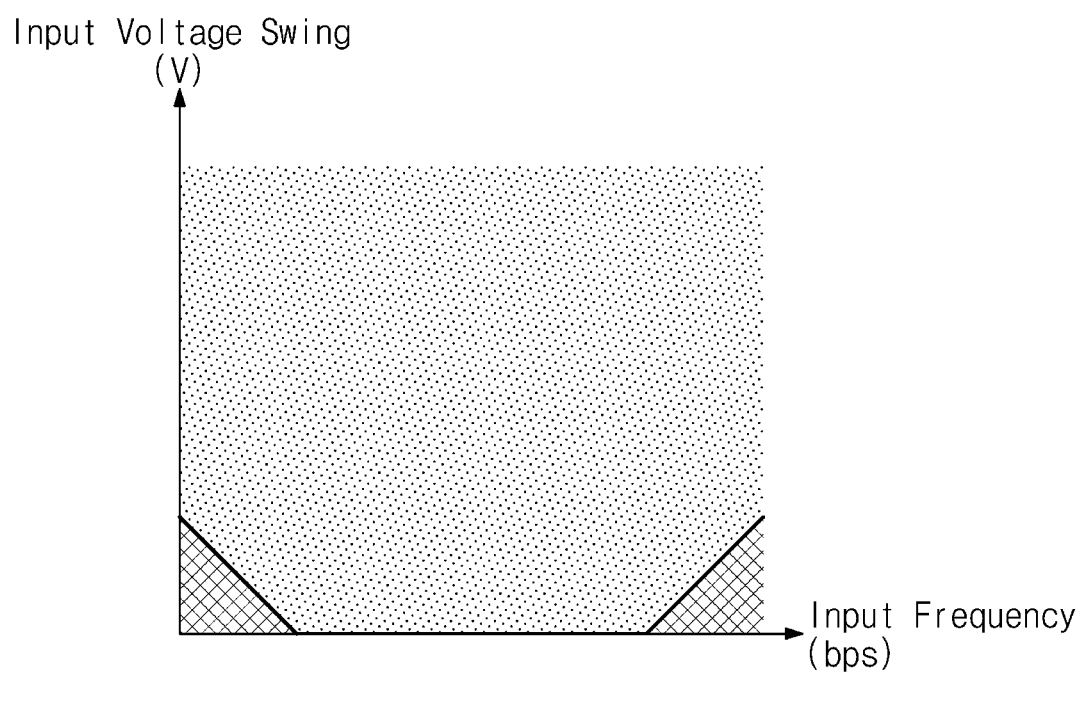

FIGS. 7A to 7C are graphs illustrating division characteristics of a frequency divider according to some embodiments of the present disclosure. In FIGS. 7A to 7C, an x-axis represents a frequency of an input signal in units of bit per second (bps), and a y-axis represents a swing level of an input signal in units of voltage (V). Below, FIGS. 7A to 7C will be described together with reference to FIGS. 1 to 6.

Referring to FIG. 7A, in the case where the frequency divider 100 is designed to have the specific self-oscillation frequency Fso, the frequency divider 100 has a division characteristic curve where the self-oscillation frequency Fso is an inflection point. Referring to an example of FIG. 7A, an upper portion of the division characteristic curve is a dividing pass region, and a lower portion of the division characteristic curve is a dividing fail region. For example, in the case where the clock signal CLK of the dividing fail region is input to the frequency divider 100, the frequency divider 100 may fail to divide the clock signal CLK. In contrast, in the case where the clock signal CLK of the dividing pass region is input to the frequency divider 100, the frequency divider 100 may successfully divide the clock signal CLK.

Referring to FIGS. 3 to 6 and 7B, the frequency divider 100 according to some embodiments of the present disclosure may adaptively adjust a self-oscillation frequency. For example, the controller 120 may generate the body bias control signal BC based on the clock frequency information FI indicating a frequency of the clock signal CLK that is currently input thereto. The ABB generator 130 may adjust levels of body biases (e.g., BB1 and BB2) to be applied to bodies of drive transistors (e.g., MD1 to MD4) and latch transistors (e.g., ML1 to ML4) based on the body bias control signal BC. As the levels of the body biases (e.g., BB1 and BB2) are adjusted, a ratio of a gain of each latch transistor (e.g., ML1 to ML4) to a gain of each drive transistor (e.g., MD1 to MD4) may change. Also, as described with reference to FIGS. 4 to 6, by adjusting sizes of transistors or adjusting resistance values, a ratio of a gain of each latch transistor (e.g., ML1 to ML4) to a gain of each drive transistor (e.g., MD1 to MD4) may change. As a result, a self-oscillation frequency may be optimized for a frequency of the clock signal CLK that is currently input to the frequency divider 100.

For example, the frequency divider 100 according to some embodiments of the present disclosure may have a division characteristic curve C1 where the self-oscillation frequency Fso is 8000 Mbps as a default value. In the case where a frequency of the clock signal CLK input to the frequency divider 100 decreases, the frequency divider 100 may adjust a body bias, a transistor size, and/or a resistance value such that there is implemented a division characteristic curve (e.g., C2 to C5) where the self-oscillation frequency Fso is lower than 8000 Mbps. However, the present disclosure is not limited thereto. For example, in the case where a frequency of the clock signal CLK input to the frequency divider 100 increases, the frequency divider 100 may adjust a body bias, a transistor size, and/or a resistance value such that there is implemented a division characteristic curve (not illustrated) where the self-oscillation frequency Fso is higher than 8000 Mbps.

Referring to FIGS. 3 to 6 and 7C, the frequency divider 100 according to some embodiments of the present disclosure may adaptively adjust a self-oscillation frequency. How the frequency divider 100 adaptively adjusts a self-oscillation frequency is described with reference to FIG. 7B, and thus, additional description will be omitted to avoid redundancy. Accordingly, the frequency divider 100 according to some embodiments of the present disclosure may secure a dividing pass region in a wider frequency band compared to FIG. 7A, and may stably divide the clock signal CLK even though a swing level of the clock signal CLK is small.

Figure 8:
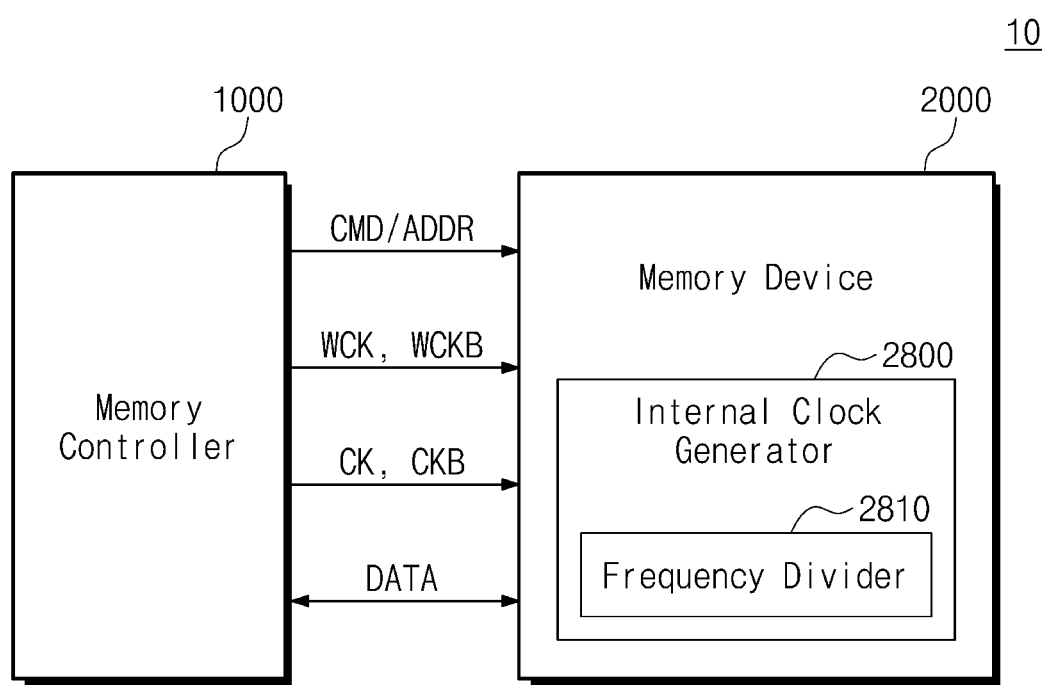
FIG. 8 is a block diagram illustrating an electronic device according to some embodiments of the present disclosure.

FIG. 8 is a block diagram illustrating an electronic device according to some embodiments of the present disclosure. Referring to FIG. 8, an electronic device 10 may include a memory controller 1000 and a memory device 2000. The electronic device 10 may refer to a device that stores data or outputs the stored data. For example, the electronic device 10 may be used to store data in the following devices: a computer, a tablet, a laptop, a notebook computer, a personal digital assistant (PDA), a mobile computing device, a smartphone, and/or Internet home appliances.

The memory controller 1000 may communicate with the memory device 2000. The memory controller 1000 may control the memory device 2000. The memory controller 1000 may store data in the memory device 2000 or may read data stored in the memory device 2000.

The memory controller 1000 may generate a command CMD, an address ADDR, a clock CK, an inverted clock CKB, a data clock WCK, and an inverted data clock WCKB. The memory controller 1000 may output a command CMD, an address ADDR, a clock CK, an inverted clock CKB, a data clock WCK, and an inverted data clock WCKB to the memory device 2000. The memory controller 1000 may output data "Data" to the memory device 2000 or may receive the data "Data" from the memory device 2000.

The memory device 2000 may receive the command CMD, the address ADDR, the clock CK, the inverted clock CKB, the data clock WCK, and the inverted data clock WCKB. The memory device 2000 may output the data "Data" to the memory controller 1000 or may receive the data "Data" from the memory controller 1000. That is, the memory device 2000 may refer to a device that stores data.

The memory device 2000 may include an internal clock generator 2800. The internal clock generator 2800 may generate an internal clock to be used for synchronization in the memory device 2000, based on the clock CK, the inverted clock CKB, the data clock WCK, and/or the inverted data clock WCKB. The internal clock generator 2800 may include a frequency divider 2810. A function and an operation of the frequency divider 2810 and a connection relationship of components of the frequency divider 2810 are similar to the function and the operation of the frequency divider 100 and the connection relationship of the components of the frequency divider 100, which are described with reference to FIGS. 1 to 7C, and thus, additional description will be omitted to avoid redundancy. The frequency divider 2810 may divide the clock CK, the inverted clock CKB, the data clock WCK, and/or the inverted data clock WCKB at a division ratio of "n". Herein, "n" is a natural number of 2 or more.

The command CMD may refer to a signal indicating an operation to be performed by the memory device 2000. For example, the command CMD may include information about a function such as read, write, refresh, precharge, mode register, CAS, or deselect (DES), but the present disclosure is not limited thereto. For example, the command CMD may be variable in kind depending on the specification that is applied to the memory device 2000.

The address ADDR may refer to a signal indicating a location of a memory rank, a memory bank, a memory cell, etc. of the memory device 2000, at which an operation is to be performed. For example, the address ADDR may include a chip select CS for activating a selected memory rank or memory chip, a row address and a column address of a memory cell of a memory bank in a selected memory rank, etc.

The clock CK may refer to a signal that toggles periodically. For example, the clock CK may be an electrical signal having a logical high level and a logical low level that are periodically repeated. The clock CK may be used to determine a timing being a reference of communication with the memory device 2000 or an internal operation of the memory device 2000. A phase of the inverted clock CKB may be opposite to a phase of the clock CK (i.e., the inverted clock CKB and the clock CK may be 180 degrees out of phase).

The data clock WCK may refer to a signal that is used to read or write data. A frequency of the data clock WCK may be higher than a frequency of the clock CK. For example, the data clock WCK may refer to a signal that toggles at a high frequency for data processing. A phase of the data clock WCK may be opposite to a phase of the inverted data clock WCKB (i.e., the data clock WCK and the inverted data clock WCKB may be 180 degrees out of phase).

In some embodiments, the memory controller 1000 and the memory device 2000 may exchange data with each other. For example, when the command CMD is a write command, the memory controller 1000 may output data to the memory device 2000. For example, when the command CMD is a read command, the memory controller 1000 may receive data from the memory device 2000. The data may be at least a portion of a computer program or application, or may be at least a portion of user data such as an image, a video, a voice, or a text.

In some embodiments, the communication between the memory controller 1000 and the memory device 2000 may comply with the specification defined in the LPDDR5.

Figure 9:
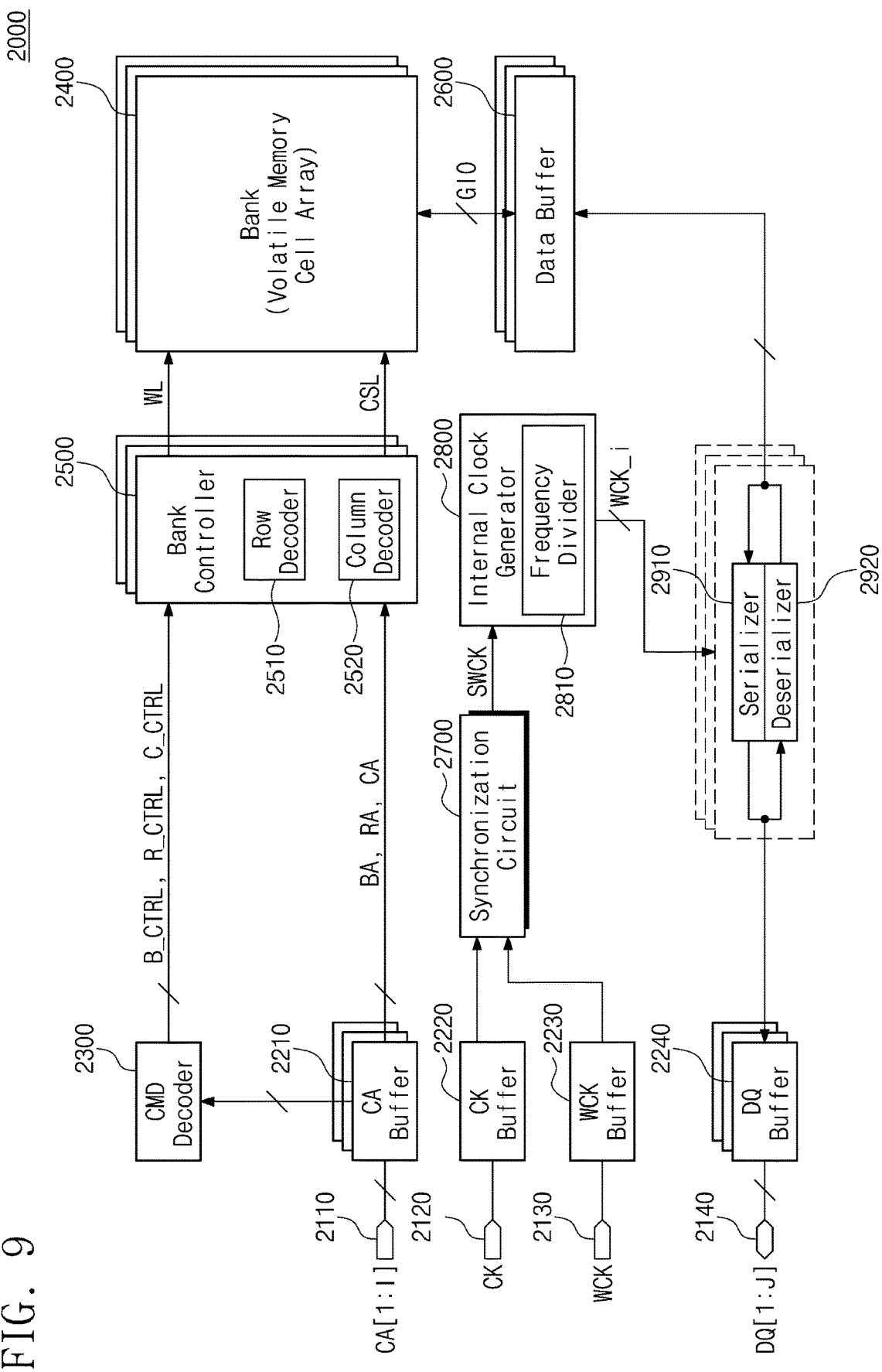
FIG. 9 is a block diagram illustrating a memory device of FIG. 8 in detail.

FIG. 9 is a block diagram illustrating a memory device of FIG. 8 in detail. For convenience of description, the description given with reference to FIG. 8 will be omitted to avoid redundancy. Referring to FIGS. 8 and 9, the memory device 2000 may include at least one memory chip. FIG. 9 shows the memory device 2000 including one memory chip as an example, and the present disclosure is not limited thereto.

For example, the memory chip may be a volatile memory chip, that is, a dynamic random access memory (DRAM) chip. For example, the DRAM chip may be a general-purpose DRAM chip, such as a double data rate synchronous dynamic random access memory (DDR SDRAM) chip, a DDR2 SDRAM chip, a DDR3 SDRAM chip, a DDR4 SDRAM chip, a DDR5 SDRAM chip, or the like, a DRAM chip for a mobile application, such as a low power double data rate (LPDDR) SDRAM chip, an LPDDR2 SDRAM chip, an LPDDR3 SDRAM chip, an LPDDR4 SDRAM chip, an LPDDR4X SDRAM chip, an LPDDR5 SDRAM chip, or the like, or a DRAM chip providing a high bandwidth, such as a graphics double data rate (GDDR) synchronous graphics random access memory (SGRAM) chip, a GDDR2 SGRAM chip, a GDDR3 SGRAM chip, a GDDR4 SGRAM chip, a GDDR5 SGRAM chip, a GDDR6 SGRAM chip, a high bandwidth memory (HBM) chip, a HBM2 chip, a HBM3 chip, a WideIO SDRAM chip, or the like.

The memory device 2000 may include command and address (CA) pins 2110, a clock (CK) pin 2120, a data clock (WCK) pin 2130, data queue (DQ) pins 2140, a CA buffer 2210, a clock buffer 2220, a data clock buffer 2230, a DQ buffer 2240, a command decoder 2300, banks 2400, bank controllers 2500, data buffers 2600, a synchronization circuit 2700, an internal clock generator 2800, a serializer 2910, and a deserializer 2920.

The CA pins 2110 may be terminals receiving CA signals CA[1:I] from the outside of the memory device 2000. The CA signals CA[1:I] may include the command CMD and the address ADDR of FIG. 8. The number of CA pins 2110 and the number of CA signals CA[1:I] may be "I", that is, may be identical to each other. Herein, "I" may be a natural number and may be in advance determined in compliance with various protocols. The CA signals CA[1:I] may include a command for controlling the memory device 2000 and an address indicating a location of memory cells in the banks 2400. The CA signals CA[1:I] may be unidirectional signals that are input only to the memory device 2000, and the CA pins 2110 may be input terminals.

The clock pin 2120 may be a terminal receiving the clock CK from the outside of the memory device 2000 (e.g., from a host or a memory controller). The clock CK may be a unidirectional signal that is input only to the memory device 2000, and the clock pin 2120 may be an input terminal. For convenience of description, only one clock pin 2120 is illustrated. However, the memory device 2000 may receive differential clock signals, and the memory device 2000 may further include a clock pin receiving an inverted clock (e.g., CKB) whose phase is opposite to a phase of the clock CK input through the clock pin 2120.

The data clock pin 2130 may be a terminal receiving the data clock WCK from the outside of the memory device 2000 (e.g., from a host or a memory controller). The data clock WCK may be a unidirectional signal that is input only to the memory device 2000, and the data clock pin 2130 may be an input terminal. For convenience of description, only one data clock pin 2130 is illustrated. However, the memory device 2000 may receive differential data clock signals, and the memory device 2000 may further include a data clock pin receiving an inverted data clock (e.g., WCKB) whose phase is opposite to a phase of the data clock WCK input through the data clock pin 2130.

The DQ pins 2140 may be terminals receiving DQ signals DQ[1:J] from the outside of the memory device 2000 or outputting the DQ signals DQ[1:J] to the outside of the memory device 2000. The DQ signals DQ[1:J] may include the data "DATA" of FIG. 8. The number of DQ pins 2140 and the number of DQ signals DQ[1:J] may be "J", that is, may be identical to each other. Herein, "J" may be a natural number and may be in advance determined in compliance with various protocols. The DQ signals DQ[1:J] may include write data associated with the write command or read data associated with the read command. The DQ signals DQ[1:J] may be bidirectional signals that are input to the memory device 2000 or are output from the memory device 2000, and the DQ pins 2140 may be input/output terminals.

The CA buffers 2210 may operate as receivers that receive the CA signals CA[1:I]. The number of CA buffers 2210 may be identical to the number of CA pins 2110. The CA buffers 2210 may sample or latch the CA signals CA[1:I] at a rising edge or a falling edge of an internal clock signal ICK. The CA buffers 2210 may transmit signals, which correspond to a command, from among the received CA signals CA[11] to the command decoder 2300. The CA buffers 2210 may transmit signals, which correspond to an address, from among the received CA signals CA[1:I] to the bank controllers 2500. Locations of the command and the address that are included in the CA signals CA[1:I] may be in advance determined in compliance with various protocols.

The clock buffer 2220 may operate as a receiver (RX) that receives the clock CK. The clock buffer 2220 may receive the clock CK. The clock buffer 2220 may output the clock CK to the synchronization circuit 2700. Although not illustrated, the clock buffer 2220 may output the clock CK to various internal components of the memory device 2000.

The clock CK may provide a timing being a reference in an overall operation of the memory device 2000.

The data clock buffer 2230 may operate as a receiver that receives the data clock WCK. The data clock buffer 2230 may operate as a receiver that receives the data clock WCK. The data clock buffer 2230 may output the data clock WCK to the synchronization circuit 2700.

The DQ buffers 2240 may include receivers receiving the DQ signals DQ[1:J] and transmitters transmitting the DQ signals DQ[1:J]. Each of the number of receivers and the number of transmitters may be identical to the number of the DQ pins 2140. The receivers of the DQ buffers 2240 may provide the received DQ signals DQ[1:J] to the deserializer 2920. The transmitters of the DQ buffers 2240 may receive the DQ signals DQ[1:J] from the serializer 2910 and may output the received DQ signals DQ[1:J] to the outside through the DQ pins 2140.

The command decoder 2300 may receive the CA signals CA[1:I] from the CA buffers 2210. The command decoder 2300 may decode signals, which correspond to a command, from among the CA signals CA[1:I]. For example, the command decoder 2300 may decode an active command, a write command, a read command, a precharge command, a mode register set (MRS) command, and the like and may control components of the memory device 2000.

The command decoder 2300 may provide a bank control signal B CTRL, a row control signal R CTRL, and a column control signal C CTRL to the bank controllers 2500 in response to the activate command, the write command, the read command, the precharge command, the refresh command, or the like. The command decoder 2300 may control operations of any other components of the memory device 2000 in addition to the above-described components.

The banks 2400 refer to memory cell arrays including memory cells repeatedly disposed. Memory cells may be disposed at intersections of word lines (not illustrated) and bit lines (not illustrated) of a bank. The number of banks 2400 may be in advance determined in compliance with various protocols of a memory chip. As the number of banks 2400 increases, the memory cells of the memory device 2000 may be divided into more banks.

The bank controllers 2500 may control the banks 2400 based on the bank control signal B CTRL, the row control signal R CTRL, and the column control signal C CTRL. In some embodiments, the bank controllers 2500 may control the banks 2400, respectively. In some embodiments, one bank controller may control two or more banks. In other words, one bank controller may be shared by two or more banks. Each of the bank controllers 2500 may include a row decoder 2510 and a column decoder 2520.

The row decoder 2510 may receive the row control signal R CTRL from the command decoder 2300, may receive a row address RA from the CA buffers 2210, and may select a word line WL. For example, to drive word lines of a bank, the row decoder 2510 may be disposed along a direction in which word lines are disposed at regular intervals.

The column decoder 2520 may receive the column control signal C CTRL from the command decoder 2300, may receive the column address CA from the CA buffers 2210, and may select a column selection line CSL. Because one or more bit lines (not illustrated) are connected with the column selection line CSL, the bit lines connected with the column selection line CSL may be selected by the column decoder 2520. For example, to drive the column selection lines of a bank, the column decoder 2520 may be disposed along a direction in which column selection lines are disposed at regular intervals.

The data buffers 2600 may provide write data to the banks 2400 through global input/output lines GIO or may receive read data from the banks 2400 through the global input/output lines GIO. The number of data buffers 2600 may be equal to the number of banks 2400, and the data buffers 2600 may exchange data with the banks 2400, respectively. Herein, the number of bits included in the write/read data may be determined in consideration of the number of prefetch bits, a burst length, the number of DQ pins 2140, and the like.

At least one of the data buffers 2600 may be selected by the command decoder 2300 depending on the read command or the write command. The number of data buffers that are selected in response to the read command or the write command may be determined, for example, depending on the number of prefetch bits of the memory device 2000.

A data buffer that is selected depending on the write command may receive write data from the deserializer 2920, and the selected data buffer may transmit the write data to selected memory cells. The selected data buffer may drive a global input/output line and the selected memory cells based on the write data.

A data buffer that is selected depending on the read command may receive and store read data output from selected memory cells depending on the read command. To this end, the selected data buffer may sense and amplify a voltage of the global input/output line. The selected data buffer may provide the read data to the serializer 2910.

The synchronization circuit 2700 may receive the clock CK from the clock buffer 2220. The synchronization circuit 2700 may receive the data clock WCK from the data clock buffer 2230. The synchronization circuit 2700 may perform phase synchronization on the data clock WCK based on the clock CK. The synchronization circuit 2700 may output a synchronized data clock SWCK to the internal clock generator 2800. Herein, the synchronized data clock SWCK may include complementary signals whose phases are opposite to each other.

The synchronization of the data clock WCK may mean matching a timing with the clock CK and allowing the data clock WCK to toggle at a reference frequency, such that data are processed within the memory device 2000. The reference frequency may be a frequency of the data clock WCK in a normal state, which is determined to read or write data in units of bit. The reference frequency may be higher than a frequency of the clock CK.

The internal clock generator 2800 may receive the synchronized data clock SWCK from the synchronization circuit 2700. The internal clock generator 2800 may generate at least one internal clock WCK_i based on the synchronized data clock SWCK and may output the internal clock WCK_i to the serializer 2910 and the deserializer 2920. The internal clock WCK_i may be used for the read operation and the write operation in the serializer 2910 and the deserializer 2920. In some embodiments, the internal clock WCK_i may include four-phase internal clocks (e.g., WCK_0, WCK_90, WCK_180, and WCK_270). Herein, "i" means a phase difference with the synchronized data clock SWCK and may have a number of 0 or more and 360 or less.

The internal clock generator 2800 may include the frequency divider 2810. The frequency divider 2810 may divide the synchronized data clock SWCK at a division ratio of "2" to generate the four-phase internal clocks (e.g., WCK_0, WCK_90, WCK_180, and WCK_270). However, the present disclosure is not limited thereto. For example, the internal clock generator 2800 may divide the synchronized data clock SWCK at an arbitrary or given ratio and may generate n-phase internal clocks. Herein, "n" is a natural number of 2 or more. The frequency divider 2810 may adaptively adjust a self-oscillation frequency based on clock frequency information indicating a frequency of the synchronized data clock SWCK. How the frequency divider 2810 adjusts a self-oscillation frequency is described with reference to FIGS. 1 to 7C, and thus, additional description will be omitted to avoid redundancy. By adaptively adjusting the self-oscillation frequency, the frequency divider 2810 may provide a dividing pass region in a wide frequency band.

The serializer 2910 and the deserializer 2920 may receive the internal clock WCK_i. The serializer 2910 and the deserializer 2920 may control an input/output of data in response to the internal clock WCK_i. In detail, the serializer 2910 may serialize bits of the read data in response to the read command. The deserializer 2920 may deserialize bits of the write data in a write operation. For example, the serializer 2910 may be implemented to include serializers, the number of which is equal to the number of DQ signals DQ[1:J], and the deserializer 2920 may be implemented to include deserializers, the number of which is equal to the number of DQ signals DQ[1:J].

Figure 10:
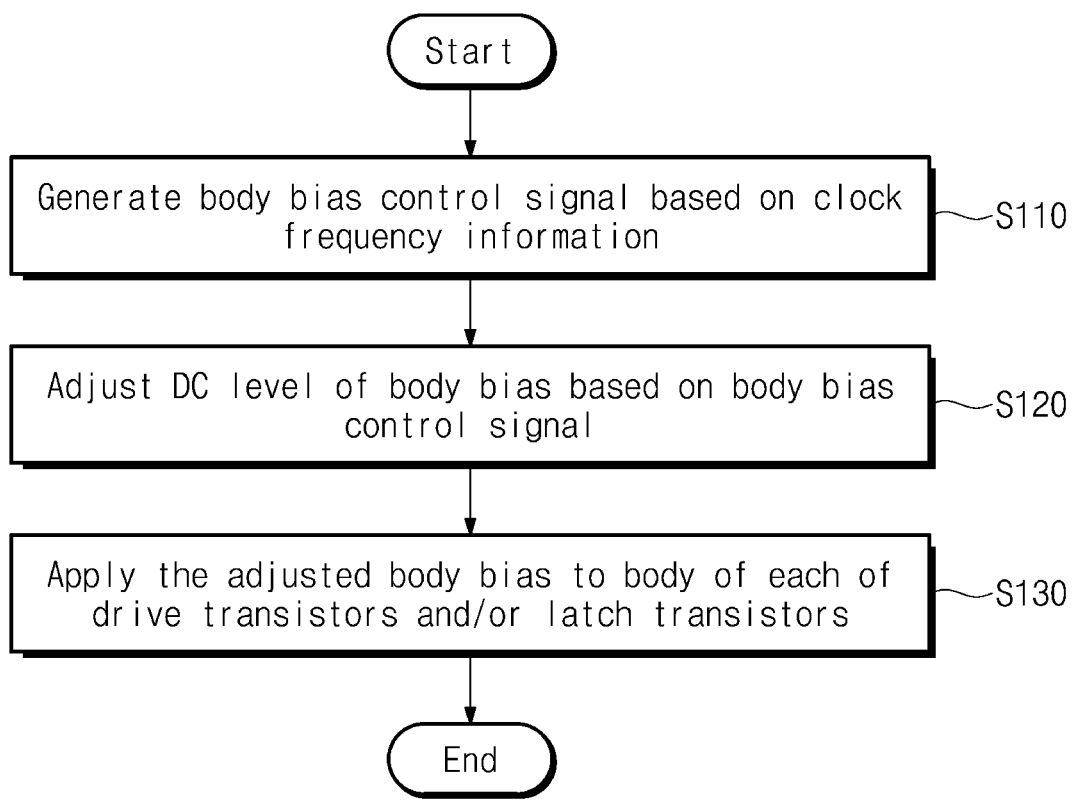
FIG. 10 is a flowchart illustrating an operation of a frequency divider according to some embodiments of the present disclosure.

FIG. 10 is a flowchart illustrating an operation of a frequency divider according to some embodiments of the present disclosure. For convenience of description, FIG. 10 will be described with reference to FIGS. 1 to 6.

In operation S110, the controller 120 may generate the body bias control signal BC based on the clock frequency information FI. The clock frequency information FI may refer to a signal indicating a frequency of the clock signal CLK that is input to the frequency dividing core circuit 110. According to some embodiments of the present disclosure, the controller 120 may generate at least one element control signal CTRL based on the clock frequency information FI. The element control signal CTRL may include the first size control signal SC1 for controlling sizes of drive transistors (e.g., MD1 to MD4), the second size control signal SC2 for controlling sizes of the latch transistors ML1 to ML4, and/or the resistor control signal RC for controlling resistance values of the resistors R1 to R4.

In operation S120, the ABB generator 130 may adjust the DC level of the body bias BB based on the body bias control signal BC. A self-oscillation frequency of the frequency dividing core circuit 110 may be changed by adjusting the DC level of the body bias BB.

In operation S130, the ABB generator 130 may apply the adjusted body bias to a body of each of the drive transistors (e.g., MD1 to MD4) and the latch transistors ML1 to ML4 included in the frequency dividing core circuit 110. The body of the transistor may be a substrate or other portion of the transistor. Applying body bias to the body of the transistor may help determine how the transistor turns on or off.

According to the present disclosure, even though a frequency of an input clock signal changes, a frequency divider may adaptively cope with a frequency change to stably perform a clock dividing operation. Also, according to the present disclosure, the frequency divider may stably perform the clock dividing operation even though a swing level of the clock signal is small.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A frequency divider comprising:
a frequency dividing core circuit comprising a plurality of transistors, and configured to generate at least one division clock signal based on a clock signal and an inverted clock signal;
a controller configured to generate a body bias control signal based on clock frequency information; and
an adaptive body bias (ABB) generator configured to generate at least one body bias based on the body bias control signal and configured to apply the at least one body bias to a body of one or more of the plurality of transistors.

2. The frequency divider of claim 1,
wherein the at least one division clock signal comprises a first, a second, a third, and a fourth division clock signal, and
wherein the frequency dividing core circuit comprises:
a first latch configured to latch logical values of the first and second division clock signals based on logical values of the clock signal and the inverted clock signal and to generate the third and fourth division clock signals based on the latched logical values of the first and second division clock signals; and
a second latch configured to latch logical values of the third and fourth division clock signals based on the logical values of the clock signal and the inverted clock signal and to generate the first and second division clock signals based on the latched logical values of the third and fourth division clock signals.

3. The frequency divider of claim 1, wherein the ABB generator is configured to adjust a DC level of the at least one body bias based on the body bias control signal.

4. The frequency divider of claim 1, wherein the controller is configured to adaptively adjust a self-oscillation frequency of the frequency dividing core circuit based on the clock frequency information.

5. The frequency divider of claim 1,
wherein the frequency dividing core circuit comprises a first latch and a second latch,
wherein the first latch comprises:
a first resistor connected between a power supply voltage terminal and a first node;
a second resistor connected between the power supply voltage terminal and a second node;
a first drive transistor connected between the first node and a first source node, and configured to operate in response to a first division clock signal;
a second drive transistor connected between the second node and the first source node, and configured to operate in response to a second division clock signal;
a first latch transistor connected between the second node and a second source node, and configured to operate in response to a third division clock signal;
a second latch transistor connected between the first node and the second source node, and configured to operate in response to a fourth division clock signal;
a first clock input transistor connected between the first source node and a first tail node, and configured to operate in response to the clock signal; and
a second clock input transistor connected between the second source node and the first tail node, and configured to operate in response to the inverted clock signal, and
wherein the second latch comprises:
a third resistor connected between the power supply voltage terminal and a third node;

a fourth resistor connected between the power supply voltage terminal and a fourth node;
a third drive transistor connected between the third node and a third source node, and configured to operate in response to the third division clock signal;
a fourth drive transistor connected between the fourth node and the third source node, and configured to operate in response to the fourth division clock signal;
a third latch transistor connected between the fourth node and a fourth source node, and configured to operate in response to the first division clock signal;
a fourth latch transistor connected between the third node and the fourth source node, and configured to operate in response to the second division clock signal;
a third clock input transistor connected between the third source node and a second tail node, and configured to operate in response to the inverted clock signal; and
a fourth clock input transistor connected between the fourth source node and the second tail node, and configured to operate in response to the clock signal.

6. The frequency divider of claim 5,
wherein the first latch further comprises:
a first tail transistor connected between the first tail node and a ground voltage terminal, and configured to operate in response to a bias voltage, and
wherein the second latch further comprises:
a second tail transistor connected between the second tail node and the ground voltage terminal, and configured to operate in response to the bias voltage.

7. The frequency divider of claim 5,
wherein the at least one body bias comprises a first body bias and a second body bias, and
wherein the ABB generator is configured to adjust DC levels of the first and second body biases based on the body bias control signal, is configured to apply the first body bias with one of the DC levels that was adjusted to the body of each of the first, second, third, and fourth drive transistors, and is configured to apply the second body bias with the one of the DC levels that was adjusted to the body of each of the first to fourth latch transistors.

8. The frequency divider of claim 7,
wherein, when a frequency of the clock signal is higher than a frequency of a default value, the controller is configured to generate the body bias control signal indicating an increase in the DC level of the first body bias, and
wherein, when the frequency of the clock signal is lower than the frequency of the default value, the controller is configured to generate the body bias control signal indicating an increase in the DC level of the second body bias.

9. The frequency divider of claim 5,
wherein the controller further is configured to generate a first size control signal based on the clock frequency information,
wherein the first latch further comprises:
a first size control transistor and a second size control transistor that are configured to be turned on or turned off in response to the first size control signal;
a fifth drive transistor connected between the first size control transistor and the first source node, and configured to operate in response to the first division clock signal; and
a sixth drive transistor connected between the second size control transistor and the first source node, and configured to operate in response to the second division clock signal, and
wherein the second latch further comprises:
a third size control transistor and a fourth size control transistor that are configured to be turned on or turned off in response to the first size control signal;
a seventh drive transistor connected between the third size control transistor and the third source node, and configured to operate in response to the third division clock signal; and
an eighth drive transistor connected between the fourth size control transistor and the third source node, and configured to operate in response to the fourth division clock signal.

10. The frequency divider of claim 5,
wherein the controller is further configured to generate a second size control signal based on the clock frequency information,
wherein the first latch further comprises:
a fifth size control transistor and a sixth size control transistor that are configured to be turned on or turned off in response to the second size control signal;
a fifth latch transistor connected between the fifth size control transistor and the second source node, and configured to operate in response to the third division clock signal; and
a sixth latch transistor connected between the sixth size control transistor and the second source node, and configured to operate in response to the fourth division clock signal, and
wherein the second latch further comprises:
a seventh size control transistor and an eighth size control transistor that are configured to be turned on or turned off in response to the second size control signal;
a seventh latch transistor connected between the seventh size control transistor and the fourth source node, and configured to operate in response to the first division clock signal; and
an eighth latch transistor connected between the eighth size control transistor and the fourth source node, and configured to operate in response to the second division clock signal.

11. The frequency divider of claim 5,
wherein the controller is further configured to generate a resistor control signal based on the clock frequency information,
wherein the first latch further comprises:
a first resistor control transistor and a second resistor control transistor that are configured to be turned on or turned off in response to the resistor control signal;
a fifth resistor connected between the first resistor control transistor and the first node; and
a sixth resistor connected between the second resistor control transistor and the second node, and
wherein the second latch further comprises:
a third resistor control transistor and a fourth resistor control transistor that are configured to be turned on or turned off in response to the resistor control signal;
a seventh resistor connected between the third resistor control transistor and the third node; and
an eighth resistor connected between the fourth resistor control transistor and the fourth node.

12. The frequency divider of claim 5, wherein a voltage level of the first node is a voltage level of the third division clock signal, a voltage level of the second node is a voltage level of the fourth division clock signal, a voltage level of the third node is a voltage level of the first division clock signal, and a voltage level of the fourth node is a voltage level of the second division clock signal.

13. The frequency divider of claim 5, wherein the first division clock signal lags the clock signal by 90 degrees, the second division clock signal lags the clock signal by 270 degrees, the third division clock signal and the clock signal are in phase, and the fourth division clock signal lags the clock signal by 180 degrees.

14. A method of operating a frequency divider having a frequency dividing core circuit comprising a plurality of drive transistors and latch transistors, the method comprising:
   generating a body bias control signal based on clock frequency information;
   adjusting a DC level of a body bias based on the body bias control signal; and
   applying the body bias with the DC level that was adjusted to a body of one or more of the plurality of drive transistors and latch transistors.

15. The method of claim 14, wherein the generating of the body bias control signal comprises:
   generating at least one element control signal based on the clock frequency information.

16. The method of claim 15, wherein at least one element control signal comprises at least one of:
   a first size control signal for controlling sizes of the drive transistors;
   a second size control signal for controlling sizes of the latch transistors; and
   a resistor control signal for controlling resistance values of resistors.

17. A memory device comprising:
   a bank comprising at least one memory cell array;
   a bank controller configured to control the bank;
   a data buffer configured to transmit write data to the bank or to receive read data from the bank;
   a clock buffer configured to receive a clock;
   a data clock buffer configured to receive a data clock;
   a synchronization circuit configured to perform phase synchronization on the data clock based on the clock and to output a synchronized data clock;
   an internal clock generator comprising a frequency divider, and configured to generate at least one internal clock based on the synchronized data clock;
   a serializer configured to operate based on the at least one internal clock and to serialize bits of the read data; and
   a deserializer configured to operate based on the at least one internal clock and to deserialize bits of the write data, and
   wherein the frequency divider comprises:
   a frequency dividing core circuit comprising a first latch that comprises first and second drive transistors in a differential pair structure and first and second latch transistors in a cross-coupled structure, and a second latch comprising third and fourth drive transistors in the differential pair structure and third and fourth latch transistors with the cross-coupled structure, and configured to divide the synchronized data clock to generate first to fourth internal clocks;
   a controller configured to generate a body bias control signal based on clock frequency information indicating a frequency of the synchronized data clock; and
   an adaptive body bias (ABB) generator configured to adjust a respective DC level of each of the first and second body biases based on the body bias control signal, to apply the first body bias with the adjusted respective DC level to a respective body of each of the first, second, third, and fourth drive transistors, and to apply the second body bias with the adjusted respective DC level to a respective body of each of the first, second, third, and fourth latch transistors.

18. The memory device of claim 17, wherein the frequency dividing core circuit has a current mode logic (CML) structure.

19. The memory device of claim 17,
   wherein the first latch is configured to generate the first internal clock having a phase equal to a phase of the synchronized data clock, and configured to generate the second internal clock lagging the synchronized data clock by 180 degrees, and
   wherein the second latch is configured to generate the third internal clock lagging the synchronized data clock by 90 degrees, and configured to generate the fourth internal clock lagging the synchronized data clock by 270 degrees.

20. The memory device of claim 17,
   wherein, when a frequency of the synchronized data clock is higher that a frequency of a default value, the controller is configured to generate the body bias control signal indicating an increase in the respective DC level of the first body bias, and
   wherein, when the frequency of the synchronized data clock is lower than the frequency of the default value, the controller is configured to generate the body bias control signal indicating an increase in the respective DC level of the second body bias.

* * * * *